United States Patent
Park

(10) Patent No.: US 11,189,349 B2
(45) Date of Patent: *Nov. 30, 2021

(54) MEMORY DEVICE AND OPERATING METHOD THEREOF

(71) Applicant: SK hynix Inc., Gyeonggi-do (KR)

(72) Inventor: Se Chang Park, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/088,685

(22) Filed: Nov. 4, 2020

(65) Prior Publication Data

US 2021/0050062 A1   Feb. 18, 2021

Related U.S. Application Data

(63) Continuation of application No. 16/422,225, filed on May 24, 2019, now Pat. No. 10,861,558.

(30) Foreign Application Priority Data

Oct. 23, 2018 (KR) .......................... 10-2018-0127053

(51) Int. Cl.
| | |
|---|---|
| G11C 11/34 | (2006.01) |
| G11C 16/04 | (2006.01) |
| G11C 16/16 | (2006.01) |
| G11C 7/10 | (2006.01) |
| G11C 16/34 | (2006.01) |

(52) U.S. Cl.
CPC .............. *G11C 16/16* (2013.01); *G11C 7/109* (2013.01); *G11C 16/34* (2013.01)

(58) Field of Classification Search
CPC ......... G11C 16/16; G11C 16/14; G11C 16/34; G11C 16/345; G11C 16/3409; G11C 7/109

See application file for complete search history.

(56) References Cited

U.S. PATENT DOCUMENTS

| | | | |
|---|---|---|---|
| 8,364,888 B2* | 1/2013 | Melik-Martirosian | ...................... G11C 11/5635 711/103 |
| 10,861,558 B2* | 12/2020 | Park | ....................... G11C 16/16 |
| 2013/0198451 A1* | 8/2013 | Hyun | ................... G11C 16/225 711/114 |
| 2017/0285969 A1* | 10/2017 | Madraswala | ........ G11C 16/225 |
| 2018/0004410 A1* | 1/2018 | Madraswala | ........... G06F 3/061 |
| 2018/0349240 A1* | 12/2018 | Ji | ......................... G06F 11/2094 |
| 2019/0079676 A1* | 3/2019 | Seo | ...................... G06F 13/4234 |
| 2019/0080773 A1* | 3/2019 | Kondo | ................ G06F 13/1689 |
| 2019/0188125 A1* | 6/2019 | Lin | ....................... G06F 3/0652 |
| 2019/0220220 A1* | 7/2019 | Kim | ...................... G06F 3/0652 |

* cited by examiner

*Primary Examiner* — Toan K Le
(74) *Attorney, Agent, or Firm* — IP & T Group LLP

(57) ABSTRACT

A memory device includes an erase operation controller for performing an erase operation on a memory block; an erase suspend count manager for managing an erase suspend count representing a number of times the erase operation is suspended until the erase operation on the memory block is completed; and a program parameter value determiner for determining a parameter value to be used for a program operation on the memory block, based on the erase suspend count.

20 Claims, 17 Drawing Sheets

| Memory block | Erase suspend count |
|---|---|
| BLK1 | 2 |
| BLK2 | 0 |
| BLK3 | 1 |
| ⋮ | ⋮ |
| BLKi | 3 |

FIG. 12

< First program parameter policy >

| Erase suspend count | Program start voltage | Number of program loops | Program step voltage |
|---|---|---|---|
| 0 | A0 | B0 | C0 |
| 1 | A1 | B1 | C1 |
| 2 | A2 | B2 | C2 |
| ⋮ | ⋮ | ⋮ | ⋮ |
| j | Aj | Bj | Cj |

< Second program parameter policy >

| Erase suspend count | Program start voltage | Number of program loops | Program step voltage |
|---|---|---|---|
| 0 | A0' | B0' | C0' |
| 1 | A1' | B1' | C1' |
| 2 | A2' | B2' | C2' |
| ⋮ | ⋮ | ⋮ | ⋮ |
| j | Aj' | Bj' | Cj' |

Erase suspend count = 0

Erase suspend count > 0

MEMORY DEVICE AND OPERATING METHOD THEREOF

CROSS-REFERENCE TO RELATED APPLICATION

This application is a continuation of U.S. patent application Ser. No. 16/422,225 filed on May 24, 2019, which claims benefits of priority of Korean Patent Application No. 10-2018-0127053 filed on Oct. 23, 2018. The disclosure of each of the foregoing application is incorporated herein by reference in its entirety.

BACKGROUND

Field of Invention

The present disclosure generally relates to a memory device and an operating method thereof, and more particularly, to a memory device capable of performing a program operation, using different parameter values depending on an erase depth of a memory block, and an operating method of the memory device.

Description of Related Art

A memory system may include a memory controller and a memory device.

The memory device may store data and output stored data under the control of the memory controller. Also, the memory device may be configured as a volatile memory device in which stored data disappears when the supply of power is interrupted, or be configured as a nonvolatile memory device in which stored data is retained even when the supply of power is interrupted.

SUMMARY

Embodiments provide a memory device capable of performing a program operation, using different parameter values depending on an erase depth of a memory block, and an operating method of the memory device.

In accordance with an aspect of the present disclosure, there is provided a memory device including an erase operation controller configured to perform an erase operation on a memory block; an erase suspend count manager configured to manage an erase suspend count representing a number of times the erase operation is suspended until the erase operation on the memory block is completed; and a program parameter value determiner configured to determine a parameter value to be used for a program operation on the memory block, based on the erase suspend count.

In accordance with another aspect of the present disclosure, there is provided a method for operating a memory device, the method including performing an erase operation on a memory block when an erase command corresponding to the memory block is received; suspending the erase operation on the memory block when an erase suspend command corresponding to the memory block is received while the erase operation on the memory block is being performed; restarting the erase operation on the memory block when an erase restart command on the memory block is received while the erase operation on the memory block is suspended; counting a number of times the erase command is received until the erase operation on the memory block is completed to generate a counted number; and determining a parameter value to be used for a program operation on the memory block, based on the counted number.

In accordance with another aspect of the present disclosure, there is provided a memory device including a memory block configured to store data; a peripheral circuit configured to perform erase and program operations on the memory block; an erase operation controller configured to control the peripheral circuit to perform the erase operation; and a program operation controller configured to control the peripheral circuit to perform the program operation with a parameter value depending on a number of times the erase operation is suspended until completion thereof.

BRIEF DESCRIPTION OF THE DRAWINGS

Various embodiments will now be described more fully with reference to the accompanying drawings; however, elements and features of the present invention may be configured or arranged differently than disclosed herein. Thus, the present invention is not limited to the embodiments set forth herein. Rather, these embodiments are provided so that this disclosure is thorough and complete and fully conveys the scope of the embodiments to those skilled in the art.

In the drawing figures, dimensions may be exaggerated for clarity of illustration. Like reference numerals refer to like elements throughout. Also, throughout the specification, reference to "an embodiment," "another embodiment" or the like is not necessary to only one embodiment, and different references to any such phrase are not necessarily to the same embodiment(s).

FIG. 12 is a diagram illustrating a program parameter policy in accordance with an embodiment of the present disclosure.

DETAILED DESCRIPTION

In the present disclosure, advantages, features and methods for achieving them will become more apparent after a reading of the following embodiments taken in conjunction with the drawings. The present invention may, however, be embodied in different forms and thus should not be construed as being limited to the embodiments set forth herein. Rather, these embodiments are provided to describe the present invention in detail to the extent that those skilled in the art to which the disclosure pertains may easily practice the present invention.

In the entire specification, when an element is referred to as being "connected" or "coupled" to another element, it can be directly connected or coupled to the another element or be indirectly connected or coupled to the another element with one or more intervening elements interposed therebetween. Also, when an element is referred to as being "between" two elements, it can be the only element between the two elements, or one or more intervening elements may also be present. In addition, when an element is referred to as "including" a component, this indicates that the element may further include another component instead of excluding another component unless there is different disclosure.

Various embodiments of the present disclosure are described below with reference to the accompanying drawings.

Figure 1:
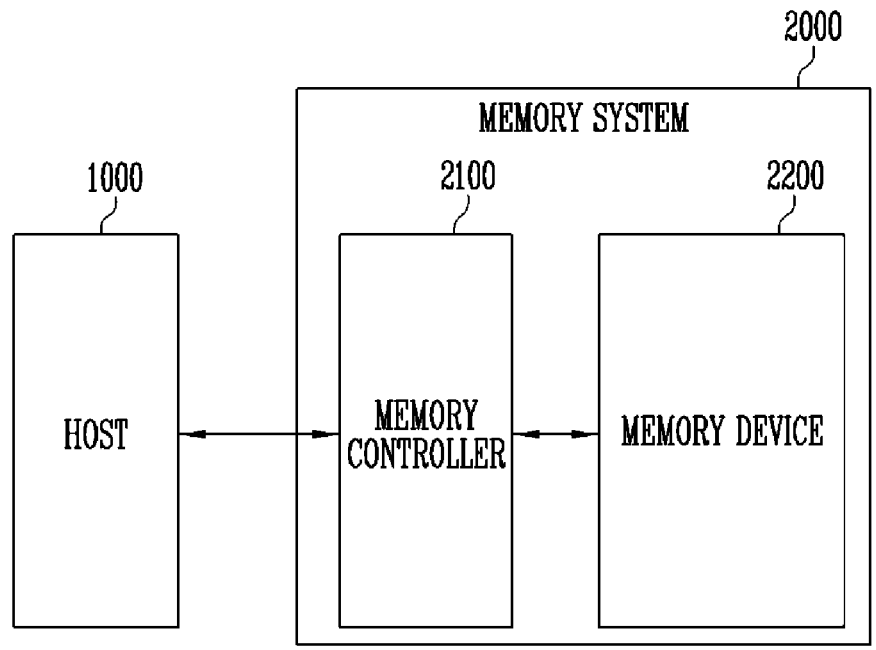
FIG. 1 is a diagram illustrating a memory system in accordance with an embodiment of the present disclosure.

FIG. 1 is a diagram illustrating a memory system in accordance with an embodiment of the present disclosure.

Referring to FIG. 1, the memory system 2000 may include a memory device 2200 configured to store data and a memory controller 2100 configured to control the memory device 2200 according to requests of a host 1000.

The host 1000 may communicate with the memory system 2000, using at least one interface protocol among a Non-Volatile Memory express (NVMe), a Peripheral Component Interconnect-Express (PCI-E), an Advanced Technology Attachment (ATA), a Serial ATA (SATA), a Parallel ATA (PATA), a Universal Serial Bus (USB), a Multi-Media Card (MMC), an Enhanced Small Disk Interface (ESDI), an Integrated Drive Electronics (IDE), a Mobile Industry Processor Interface (MIPI), a Universal Flash Storage (UFS), a Small Computer Small Interface (SCSI), and a Serial Attached SCSI (SAS). More generally, the host 1000 may communicate with the memory system 2000 using any suitable protocol or technique.

The memory controller 2100 may control overall operations of the memory system 2000, and control data exchange between the host 1000 and the memory device 2200. In a program operation, the memory controller 2100 may transmit a command, an address, data, etc. to the memory device 2200. In a read operation or erase operation, the memory controller 2100 may transmit a command, an address, and the like to the memory device 2200.

The memory device 2200 may be configured as a volatile memory device in which stored data disappears when the supply of power is interrupted or a nonvolatile memory device in which stored data is retained even when the supply of power is interrupted. The memory device 2200 may perform a program operation, a read operation, an erase operation, and the like under the control of the memory controller 2100. The memory device 2200 may include a plurality of memory blocks configured to store data.

Figure 2:
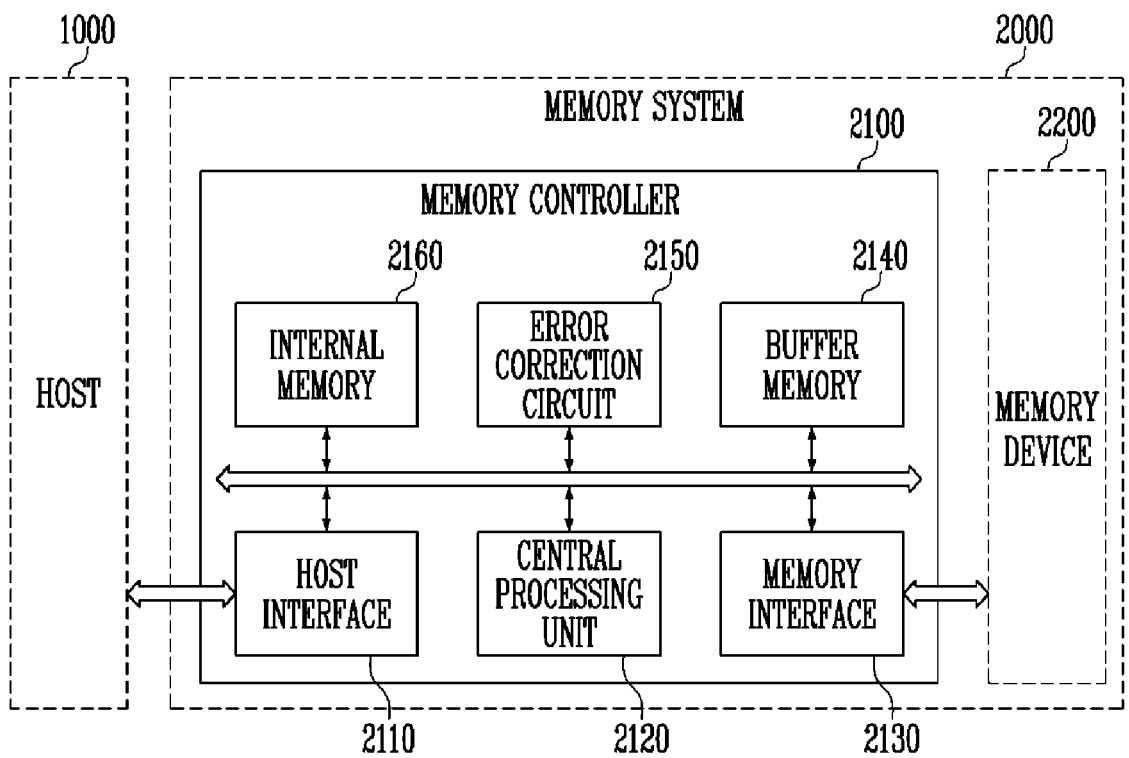
FIG. 2 is a diagram illustrating an exemplary memory controller shown in FIG. 1.

FIG. 2 is a diagram illustrating an example of the memory controller shown in FIG. 1.

Referring to FIG. 2, the memory controller 2100 may include a host interface 2110, a central processing unit (CPU) 2120, a memory interface 2130, a buffer memory 2140, an error correction circuit 2150, and an internal memory 2160. The host interface 2110, the memory interface 2130, the buffer memory 2140, the error correction circuit 2150, and the internal memory 2160 may be controlled by the CPU 2120.

The host interface 2110 may exchange data with the host 1000, using various interface protocols. For example, the host interface 2110 may communicate with the host 1000, using at least one interface protocol among a Non-Volatile Memory express (NVMe), a Peripheral Component Interconnect-Express (PCI-E), an Advanced Technology Attachment (ATA), a Serial ATA (SATA), a Parallel ATA (PATA), a Universal Serial Bus (USB), a Multi-Media Card (MMC), an Enhanced Small Disk Interface (ESDI), an Integrated Drive Electronics (IDE), a Mobile Industry Processor Interface (MIPI), a Universal Flash Storage (UFS), a Small Computer Small Interface (SCSI), and a Serial Attached SCSI (SAS). More generally, the host interface 2110 may communicate with the host 1000 using any suitable protocol or technique.

The host interface 2110 may receive a program request and user data corresponding to the program request from the host 1000. The host interface 2100 may transfer the program request to the CPU 2120, and transfer the user data to the buffer memory 2140. The host interface 2110 may receive a read request or erase request from the host 1000, and transfer the received read request or erase request to the CPU 2120.

The CPU 2120 may perform various calculations or generate a command and an address so as to control the memory device 2200. For example, the CPU 2120 may generate various commands necessary for a program operation, a read operation, and an erase operation.

The CPU 2120 may translate a logical address received from the host 1000 into a physical address so as to control an operation of the memory device 2200. The CPU 2120 may translate a logical address into a physical address or translate a physical address into a logical address, using an address mapping table stored in the internal memory 2160. The CPU 2120 may update the address mapping table when new data is programmed to the memory device 2200 or when data stored in the memory device 2200 is erased.

In an embodiment, the CPU 2120 may control the memory device 2200 to perform an erase operation. For example, when an erase request is received from the host 1000, the CPU 2120 may generate an erase command and an address, and transmit the generated erase command and the generated address to the memory device 2200.

In an embodiment, when the memory device 2200 is requested to perform another operation while performing an erase operation, the CPU 2120 may control the memory device 2200 to suspend the erase operation being currently performed. For example, the CPU 2120 may generate an erase suspend command and an address, and transmit the generated erase suspend command and the generated address to the memory device 2200. In an embodiment, the other operation, which is requested while the erase operation, is performed, may be a program operation or read operation, but embodiments of the present disclosure are not limited thereto. For example, the CPU 2120 may control an operation of the memory device 2200 within a range satisfying a requested Quality of Service (QoS). For example, in order to satisfy a QoS for a read operation while the memory device 2200 is performing an erase operation, the CPU 2120 may suspend the erase operation being performed by the memory device 2200, and control the memory device 2200 to perform the read operation. For example, when a request for requesting the CPU 2120 to flush data stored in the buffer memory 2140 to the memory device 2200 is received from the host 1000 while the memory device 2200 is performing an erase operation or when it is autonomously determined that it is necessary to flush data stored in the buffer memory 2140 to the memory device 2200, the CPU 2120 may suspend the erase operation being performed by the memory device 2200, and control the memory device 2200 to perform a program operation.

In an embodiment, when the memory device 2200 completes performance of the other operation, the CPU 2120 may control the memory device 2200 to restart the suspended erase operation. For example, the CPU 2120 may generate an erase restart command and an address, and transmit the generated erase restart command and the generated address to the memory device 2200.

In an embodiment, the CPU 2120 may control the memory device 2200 to perform a program operation. The program operation may include at least one of a soft program operation and a normal program operation. The soft program operation may be an operation for increasing a threshold voltage of memory cells included in a memory block or narrowing the width of a threshold voltage distribution. The normal program operation may be an operation for storing data in memory cells included in a memory block. The CPU 2120 may generate a program command and an address for the soft program operation or the normal program operation, and transmit the generated program command and the generated address to the memory device 2200.

In an embodiment, when the memory device 2200 completes an erase operation on a memory block, the CPU 2120 may generate a program command and an address, and transmit the generated program command and the generated address to the memory device 2200 such that a soft program operation on the corresponding memory block can be performed.

In an embodiment, the CPU 2120 may generate a status check command to check whether the memory device 2200 is performing an erase operation or another operation or has completed the erase operation or the other operation, and transmit the generated status check command to the memory device 2200. The CPU 2120 may check whether the memory device 2200 is performing the erase operation or the other operation or has completed either of those operations based on a status check result received from the memory device 2200 corresponding to the status check command.

The memory interface 2130 may communicate with the memory device 2200 using various interface protocols, such as any of those identified above.

The buffer memory 2140 may temporarily store data while the memory controller 2100 controls the memory device 2200. For example, the buffer memory 2140 may temporarily store user data received from the host 1000 until a program operation is completed.

The error correction circuit 2150 may perform error correction encoding during a program operation. The error correction circuit 2150 may perform error correction decoding during a read operation.

The internal memory 2160 may be used as a storage for storing various information for an operation of the memory controller 2100. The internal memory 2160 may store a plurality of tables. For example, the internal memory 2160 may store an address mapping table in which logical addresses and physical addresses are mapped.

Figure 3:
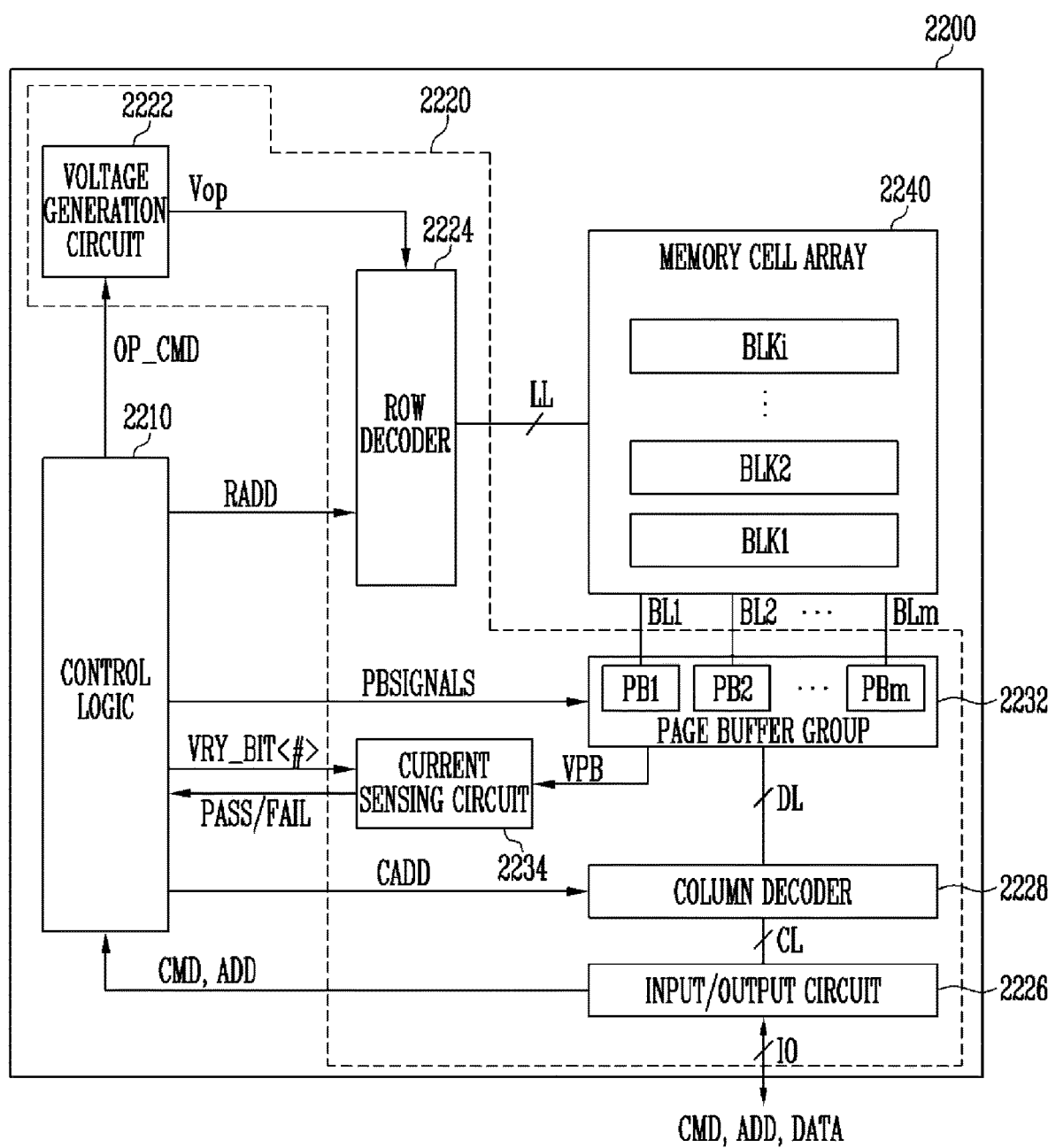
FIG. 3 is a diagram illustrating a memory device in accordance with an embodiment of the present disclosure.

FIG. 3 is a diagram illustrating a memory device in accordance with an embodiment of the present disclosure. The memory device shown in FIG. 3 may be applied to the memory system shown in FIGS. 1 and 2.

The memory device 2200 may include control logic 2210, a peripheral circuit 2220, and a memory cell array 2240.

The control logic 2210 may control the peripheral circuit 2220 including components thereof under the control of the memory controller 2100 shown in FIGS. 1 and 2.

The control logic 2210 may control the peripheral circuit 2220 in response to a command CMD and an address ADD, which are received from the memory controller 2100 through an input/output circuit 2226. For example, the control logic 2210 may output an operation signal OP_CMD, a row address RADD, a column address CADD, page buffer control signals PBSIGNALS, and an allow bit VRY_BIT<#> in response to the command CMD and the address ADD. The control logic 2210 may determine whether a verify operation has passed or failed in response to a pass or fail signal PASS or FAIL received from a current sensing circuit 2234.

The control logic 2210 may perform an erase operation, a program operation or the like on a selected memory block by controlling the peripheral circuits 2220. When the control logic 2210 is requested to suspend an erase operation on a memory block while performing the erase operation, the control logic 2210 may suspend the erase operation by controlling the peripheral circuits 2220. When the control logic 2210 is requested to restart the erase operation on the memory block in a state in which the erase operation is suspended, the control logic 2210 may restart the erase operation by controlling the peripheral circuit 2220.

The control logic 2210 may control the peripheral circuit 2220 to perform a program operation on a memory bock of which erase operation has been completed. For example, the control logic 2210 may determine parameter values used to perform the program operation on the memory block, and control the peripheral circuit 2220 to perform the program operation on the memory block using the determined parameter values. For example, parameter values used to perform the program operation may include at least one of a program start voltage, a number of program loops, and a program step voltage.

The peripheral circuit 2220 may perform a soft program operation for increasing a threshold voltage of memory cells, a normal program operation for storing data in memory cells, a read operation for outputting data stored in memory cells, an erase operation for erasing data stored in memory cells, and the like.

The peripheral circuit 2220 may include a voltage generation circuit 2222, a row decoder 2224, the input/output circuit 2226, a column decoder 2228, a page buffer group 2232, and the current sensing circuit 2234.

The voltage generation circuit 2222 may generate various operating voltages Vop used in program, read, and erase operations in response to the operation signal OP_CMD received from the control logic 2210. For example, the voltage generation circuit 2222 may transfer a program voltage, a verify voltage, a pass voltage, a read voltage, an erase voltage, a turn-on voltage, and the like to the row decoder 2224.

The row decoder 2224 may transfer the operating voltages Vop to local lines LL connected to a selected memory block among memory blocks of the memory cell array 2240 in response to the row address RADD received from the control logic 2210. The local lines LL may include local word lines, local drain select lines, and local source select lines. In addition, the local lines LL may include various lines such as a source line, which are connected to the memory block.

The input/output circuit 2226 may transfer the command CMD and the address ADD, which are received from the memory controller 2100 through input/output lines TO, to the control logic 2210, or exchange data DATA with the column decoder 2228.

The column decoder 2228 may transfer data between the input/output circuit 2226 and the page buffer group 2232 in response to a column address CADD received from the control logic 2210. For example, the column decoder 2228 may exchange data with page buffers PB1 to PBm through data lines DL, or exchange data with the input/output circuit 2226 through column lines CL.

The page buffer group 2232 may be connected to bit lines BL1 to BLm commonly connected to memory blocks BLK1 to BLKi. The page buffer group 2232 may include a plurality of page buffers PB1 to PBm connected to the bit lines BL1 to BLm. For example, one page buffer may be connected to corresponding one of the bit lines. The page buffers PB1 to PBm may operate in response to the page buffer control signals PBSIGNALS received from the control logic 2210. For example, in a program operation, the page buffers PB1 to PBm may temporarily store program data received from the memory controller 2100, and adjust a voltage applied to the bit lines BL1 to BLm according to the program data. Also, in a read operation, the page buffers PB1 to PBm may temporarily store data received through the bit lines BL1 to BLm, or sense a voltage or current of the bit lines BL1 to BLm.

During a read or verify operation, the current sensing circuit 2234 may generate a reference current in response to the allow bit VRY_BIT<#> received from the control logic 2210, and output a pass signal PASS or a fail signal FAIL by comparing a sensing voltage VPB received from the page buffer group 2232 with a reference voltage generated by the reference current.

The memory cell array 2240 may include a plurality of memory blocks BLK1 to BLKi in which data is stored. User data and various information used to perform an operation of the memory device 2200 may be stored in the memory blocks BLK1 to BLKi. The memory blocks BLK1 to BLKi may be implemented in a two-dimensional structure or a three-dimensional structure, and be configured identical to one another.

Any of the memory blocks BLK1 to BLKi may be a Single Level Cell (SLC) block or a Multi Level Cell (MLC) block according to the number of bits of data stored in a memory cell of that memory block. The SLC block may be a block driven in a manner that stores data of 1 bit in one memory cell, and the MLC block may be a block driven in a manner that store data of 2 bits or more in one memory cell. That is, the memory device 2200 may include at least one of an n-bit MLC block and an SLC block. n-bit data may be programmed in each of memory cells included in the n-bit MLC block, and data of 1 bit may be programmed in each of memory cells included in the SLC block. Here, 'n' may be a natural number of 2 or more.

Figures 4, 5:
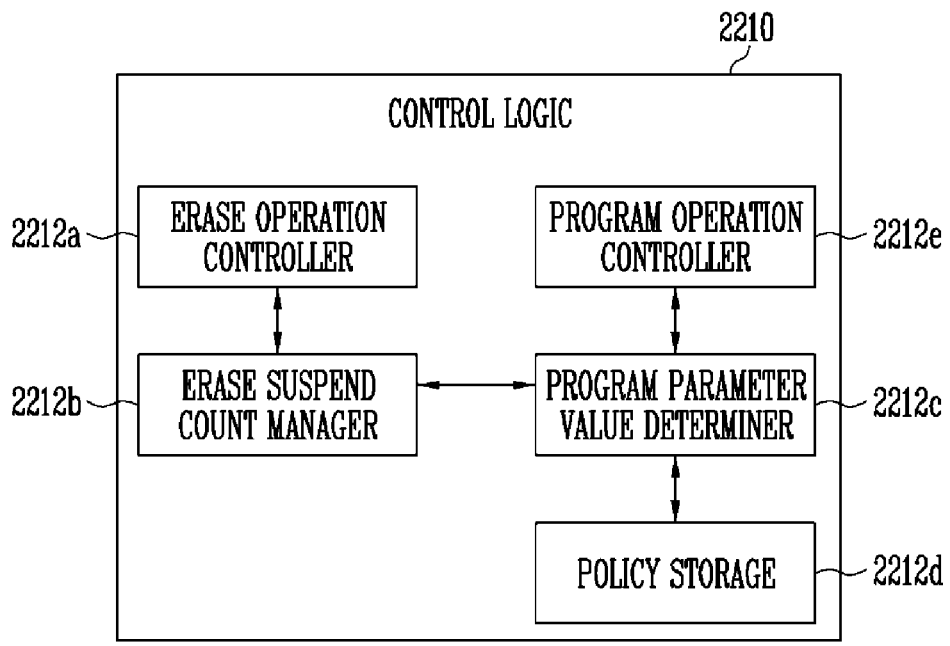
FIG. 4 is a diagram illustrating exemplary control logic shown in FIG. 3.
FIG. 5 is a diagram illustrating an example of managing an erase suspend count for each memory block.

FIG. 4 is a diagram illustrating control logic, such as that shown in FIG. 3.

Referring to FIG. 4, the control logic 2210 in accordance with an embodiment of the present disclosure may include an erase operation controller 2212a, an erase suspend count manager 2212b, a program parameter value determiner 2212c, a policy storage 2212d, and a program operation controller 2212e.

The erase operation controller 2212a may control an erase operation on a memory block.

In an embodiment, when an erase command and an address are received from the memory controller, the erase operation controller 2212a may perform an erase operation on a memory block corresponding to the received address. For example, the erase operation controller 2212a may determine a level of an erase voltage to be applied to the memory block, a time of which the erase voltage is applied, a number of which the erase voltage is applied, and the like, and perform the erase operation on the memory block by using these determined parameters. In an embodiment, default values may be used as the level of the erase voltage to be applied to the memory block, the time of which the erase voltage is applied, the number of which the erase voltage is applied, and the like.

In an embodiment, the erase operation controller 2212a may suspend an erase operation on a memory block when an erase suspend command and an address corresponding to the memory block are received from the memory controller while the erase operation on the memory block is being performed.

In an embodiment, the erase operation controller 2212a may restart an erase operation on a memory block when an erase restart command and an address corresponding to the memory block are received from the memory controller while the erase operation on the memory block is being suspended. That the erase operation on the memory block is restarted may mean that an erase voltage is again applied to the memory block from the beginning.

The erase suspend count manager 2212b may count a number of times an erase operation on a memory block is suspended until the erase operation on the memory bock is completed (which may be referred to as an erase suspend count), and manage the erase suspend count corresponding to the memory block. In other words, the erase suspend count manager 2212b may manage an erase suspend count with respect to each of a plurality of memory blocks. For example, when an erase suspend command and an address are received from the memory controller, the erase operation controller 2212a may notify the erase suspend count manager 2212b that the erase suspend command with respect to the corresponding address has been received. When that notification is received, the erase suspend count manager 2212b may increase, by 1, an erase suspend count of a memory block to which the corresponding address points. To this end, the erase suspend count manager 2212b may have address information for each memory block, which is stored therein. In some embodiments, the address information for each memory block may be stored in a separate storage located in the memory device, and the erase suspend count manager 2212b may refer to the address information for each memory block, which is stored in the separate storage. The erase suspend count may be maintained until a soft program operation or normal program operation on the corresponding memory block is performed, and the erase suspend count of the corresponding memory block may be initialized when the soft program operation or normal program operation on the corresponding memory block is performed.

The program parameter value determiner 2212c may determine at least one parameter value used for a program operation, and provide the determined parameter value to the program operation controller 2212e. The program operation may include at least one of a soft program operation and a normal program operation. Parameters used for the program operation may include at least one of a program start voltage, a number of program loops to be executed, and a program step voltage, but embodiments of the present disclosure are not limited thereto.

In an embodiment, when a request is received from the program operation controller 2212e, the program parameter value determiner 2212c may determine at least one parameter value to be used for a program operation on a memory block. For example, the program operation controller 2212e may request the program parameter value determiner 2212c to provide at least one parameter value to be used for a program operation on a memory block on which the program operation is to be performed while providing information (e.g., an index) of the corresponding memory block to the program parameter value determiner 2212c. In some embodiments, the program operation controller 2212e may further provide the program parameter value determiner 2212c with information on whether the program operation to be performed on the memory block is a soft program operation or normal program operation.

The program parameter value determiner 2212c may request the erase suspend count manager 2212b to provide an erase suspend count corresponding to the memory block corresponding to the information (e.g., the index) received from the program operation controller 2212e. Accordingly, the erase suspend count manager 2212b may provide the program parameter value determiner 2212c with an erase suspend count corresponding to the memory block.

The program parameter value determiner 2212c may determine at least one parameter value to be used for a program operation on the memory block, based on the erase suspend count corresponding to the memory block. In an embodiment, the program parameter value determiner 2212c may determine a program start voltage to increase when the erase suspend count corresponding to the memory block increases. In an embodiment, the program parameter value determiner 2212c may determine a number of program loops to increase when the erase suspend count corresponding to the memory block increases. In an embodiment, the program parameter value determiner 2212c may determine a program step voltage to increase when the erase suspend count corresponding to the memory block increases. In an embodiment, the program parameter value determiner 2212c may determine a parameter value differently depending on whether the program operation to be performed on the memory block is a soft program operation or normal program operation. For example, the program parameter value determiner 2212 may determine a program start voltage for the soft program operation to have a lower voltage level than a program start voltage for the normal program operation. For example, the program parameter value determiner 2212 may determine a number of program loops for the soft program operation to be smaller than a number of program loops for the normal program operation. For example, the program parameter value determiner 2212 may determine a program step voltage for the soft program operation to have a lower voltage level than a program step voltage for the normal program operation.

In an embodiment, the program parameter value determiner 2212c determines a parameter value used for the program operation by referring to a set program parameter policy. The program parameter policy may define different parameter values corresponding to the number of times an erase operation is suspended.

The program parameter value determiner 2212c may select a parameter value corresponding to the erase suspend count corresponding to the memory block on which the program operation is to be performed by referring to the program parameter policy. The program parameter value determiner 2212c may determine the selected parameter value as a parameter value for the program operation on the memory block.

In an embodiment, the program parameter policy may include a first program parameter policy corresponding to the soft program operation and a second program parameter policy corresponding to the normal program operation. When the program operation to be performed on the memory block is the soft program operation, the program parameter value determiner 2212c may determine a parameter value with reference to the first program parameter policy. When the program operation to be performed on the memory block is the normal program operation, the program parameter value determiner 2212c may determine a parameter value with reference to the second program parameter policy.

The policy storage 2212d may store the program parameter policy. For example, the policy storage 2212d may store at least one of the first program parameter policy corresponding to the soft program operation and the second program parameter policy corresponding to the normal program operation.

The program operation controller 2212e may control a program operation on a memory block. For example, the program operation controller 2212e may perform at least one of a soft program operation and a normal program operation on the memory block. At least one of the soft program operation and the normal program operation may be performed using an Incremental Step Pulse Programming (ISPP) scheme.

When an erase operation on a memory block is completed, the program operation controller 2212e may perform a soft program operation on the memory block. The program operation controller 2212e may request the program parameter value determiner 2212c to transmit a parameter value to be used for the soft program operation on the memory block. The program operation controller 2212e may receive at least one parameter value to be used for the soft program operation from the program parameter value determiner 2212c. The program operation controller 2212e may perform the soft program operation on the memory block, using the at least one parameter value received from the program parameter value determiner 2212c.

In an embodiment, when an erase operation on a memory block is completed, the program operation controller 2212e may perform a soft program operation on the memory block through autonomous determination. In an embodiment, when a command for instructing the memory device to perform a soft program operation on a memory block of which an erase operation has been completed is received from the memory controller, the program operation controller 2212e may perform the soft program operation on the memory block.

When a command for a normal program operation, an address, and data are received from the memory controller, the program operation controller 2212e may perform the normal program operation on a memory block corresponding to the received address.

When a command for instructing the memory device to perform a normal program operation is received from the memory controller, the program operation controller 2212e may request the program parameter value determiner 2212c to transmit a parameter value to be used in the normal program operation on the corresponding memory block, and receive at least one parameter value to be used in the normal program operation from the program parameter value determiner 2212c. The program operation controller 2212e may perform the normal program operation on the memory block, using the at least one parameter value received from the program parameter value determiner 2212c.

FIG. 5 is a diagram illustrating an example of managing an erase suspend count for each memory block.

Here, the memory device includes i (i is a natural number) memory blocks BLK1 to BLKi. Thus, the control logic may manage an erase suspend count for each of the i memory blocks BLK1 to BLKi. That is, the control logic may manage how many times erase operation on a memory block is suspended until the erase operation for the memory block is completed. In other words, the control logic may manage a number of times an erase suspend command on a memory block is received while an erase operation on the memory block is being performed.

In the example of FIG. 5, an erase suspend count of the memory block BLK1 is 2, an erase suspend count of the memory block BLK2 is 0, an erase suspend count of the memory block BLK3 is 1, and an erase suspend count of the memory block BLKi is 3.

Figure 6:
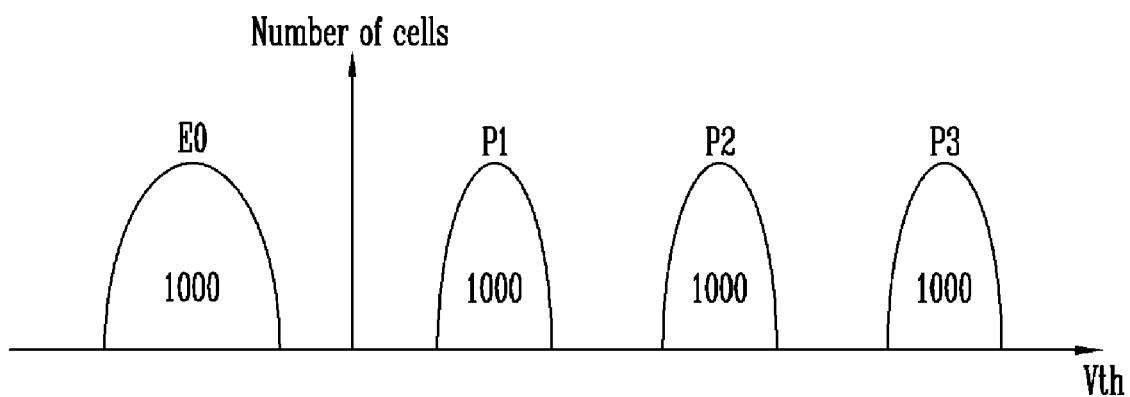
FIG. 6 is a diagram illustrating an exemplary threshold voltage distribution of memory cells on which a normal program operation is performed.

FIG. 6 is a diagram illustrating an exemplary threshold voltage distribution of memory cells on which a normal program operation is performed.

FIG. 6 illustrates, by way of example, a threshold voltage distribution of memory cells in one memory block, which cells operate in a 2-bit MLC mode.

Each of the memory cells operating in the 2-bit MLC mode may have a threshold voltage corresponding to any one of four states. For example, each of the memory cells operating in the 2-bit MLC mode may have a threshold voltage corresponding to an erase state E0, a first program state P1, a second program state P2, or a third program state P3.

FIG. 6 illustrates, by way of example, a memory block that includes 4000 memory cells, which are distributed equally among the four (4) states identified above.

Figure 7:
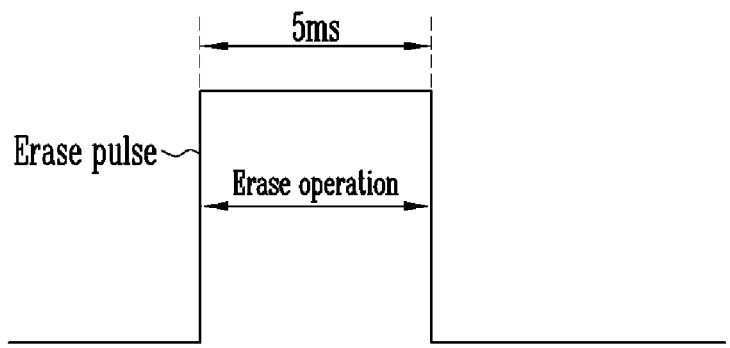
FIG. 7 is a diagram illustrating an exemplary erase pulse applied in an erase operation.

FIG. 7 is a diagram illustrating an exemplary erase pulse applied in an erase operation.

FIG. 7 illustrates, as an example, application of an erase pulse for 5 ms in an erase operation on a memory block. That is, the erase operation on the memory block may be performed during a time for which the erase pulse is applied.

While FIG. 7 illustrates that one erase pulse is applied in an erase operation on a memory block, the present invention is not limited to that arrangement. In some embodiments, two or more erase pulses may be applied in an erase operation.

Figure 8:
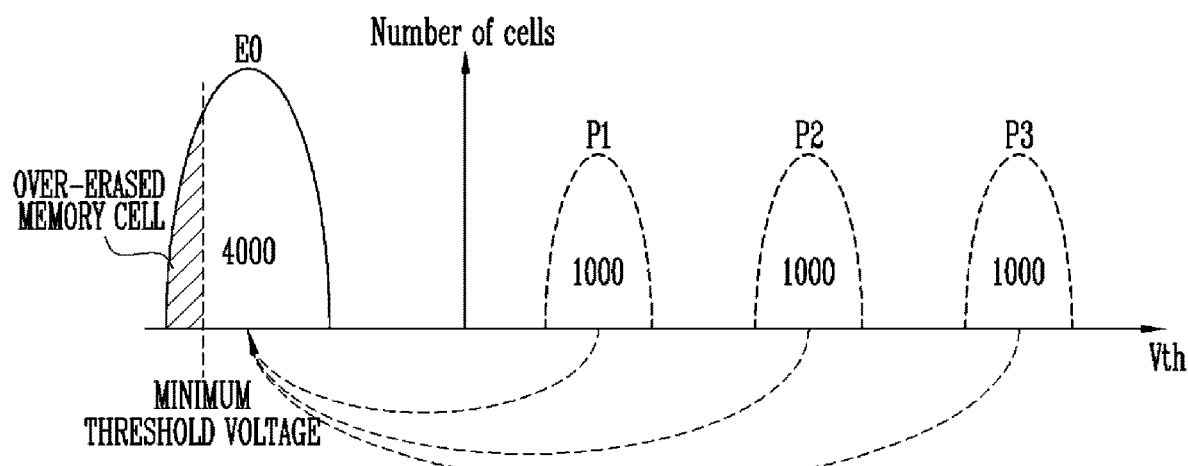
FIG. 8 is a diagram illustrating an exemplary threshold voltage distribution of memory cells on which an erase operation is performed.

FIG. 8 is a diagram illustrating an exemplary threshold voltage distribution of memory cells on which an erase operation is performed.

In the embodiment of FIG. 8, one memory block includes 4000 memory cells operating in a 2-bit MLC mode.

When an erase operation on a memory block is completed, all memory cells in the memory block may have a threshold voltage corresponding to the erase state E0. Referring to FIG. 8, it can be seen that memory cells having the first program state P1, the second program state P2, and the third program state P3 have all been changed to the erase state E0.

Some of the memory cells in the erase state E0 may have a threshold voltage lower than a set value, e.g., a minimum threshold voltage. The slashed portion in FIG. 8 shows a threshold voltage distribution of such memory cells. These memory cells, i.e. those having the threshold voltage lower than the minimum threshold voltage, may be referred to as over-erased or deeply erased memory cells. The over-erased memory cells may become a factor that delays a program operation time when a normal program operation is performed later. In addition, when the normal program operation is performed on over-erased memory cells, the retention performance of the corresponding memory cells may be deteriorated.

Figure 9:
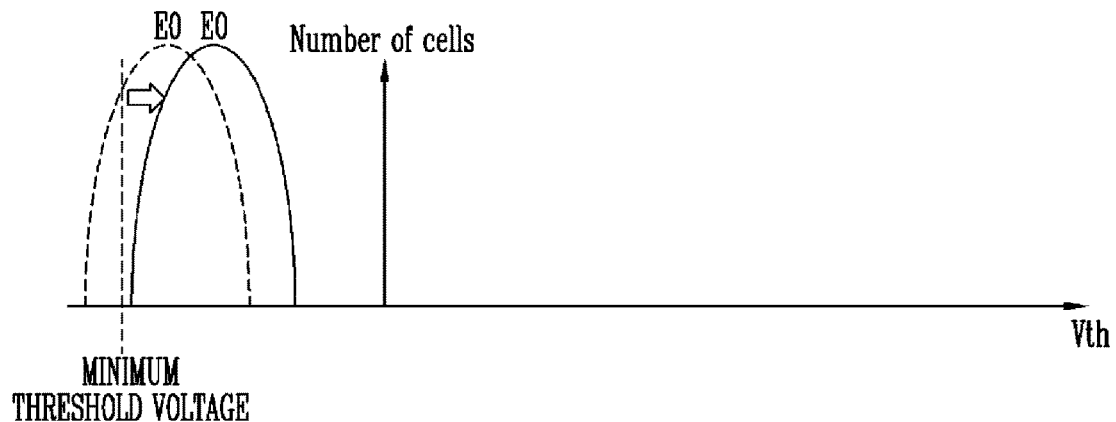
FIG. 9 is a diagram illustrating an exemplary threshold voltage distribution of memory cells on which a soft program operation is performed.

FIG. 9 is a diagram illustrating an exemplary threshold voltage distribution of memory cells on which a soft program operation is performed.

The memory device 2200 may perform a soft program operation for increasing a threshold voltage of over-erased memory cells through autonomous determination or in response to a request from the memory controller. The soft program operation may be performed such that a threshold voltage of all memory cells corresponding to the erase state E0 is higher than the minimum threshold voltage.

Referring to FIG. 9, it can be seen that the threshold voltage distribution of the memory cells corresponding to the erase state E0 has been moved right along the threshold voltage axis to a higher threshold as compared with the case shown in FIG. 8. That is, it can be seen that all the memory cells having the erase state E0 have a threshold voltage greater than or equal to the minimum threshold voltage.

Figure 10:
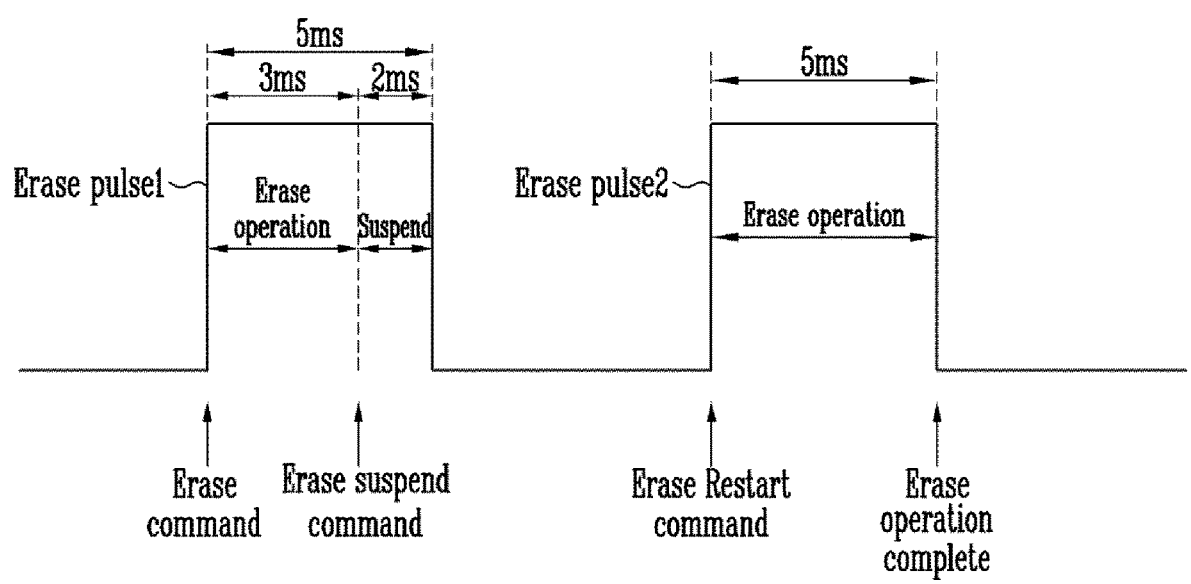
FIG. 10 is a diagram illustrating an exemplary process of suspending and restarting an erase operation.

FIG. 10 is a diagram illustrating an exemplary process of suspending and restarting an erase operation.

In the embodiment of FIG. 10, an erase operation is completed when one erase pulse is applied to a memory block for 5 ms without pause.

First, when an erase command is received, erase pulse 1 may be applied to the memory block. After such pulse has been applied for 3 ms, an erase suspend command is received. Thus, the erase operation on the memory block may be performed for the first 3 ms. However, the erase operation may be suspended for the remaining 2 ms. Since the erase pulse 1 is applied to the memory block for 3 ms, a threshold voltage of memory cells in the memory block may be decreased a certain amount.

Subsequently, an erase restart command may be received, and erase pulse 2 may be applied to the memory block. The erase pulse 2 is to be applied to the memory block for 5 ms such that the erase operation on the memory block is completed. That is, although the erase operation is suspended after the erase pulse 1 is applied for 3 ms, the erase pulse 2 is to be applied to the memory block for 5 ms.

When the erase operation is suspended and then restarted, the threshold voltage of the memory cells may be decreased as compared with a situation in which the erase operation is not suspended. That is, an erase depth of the memory cells may vary depending on a number of times the erase operation is suspended.

Figure 11:
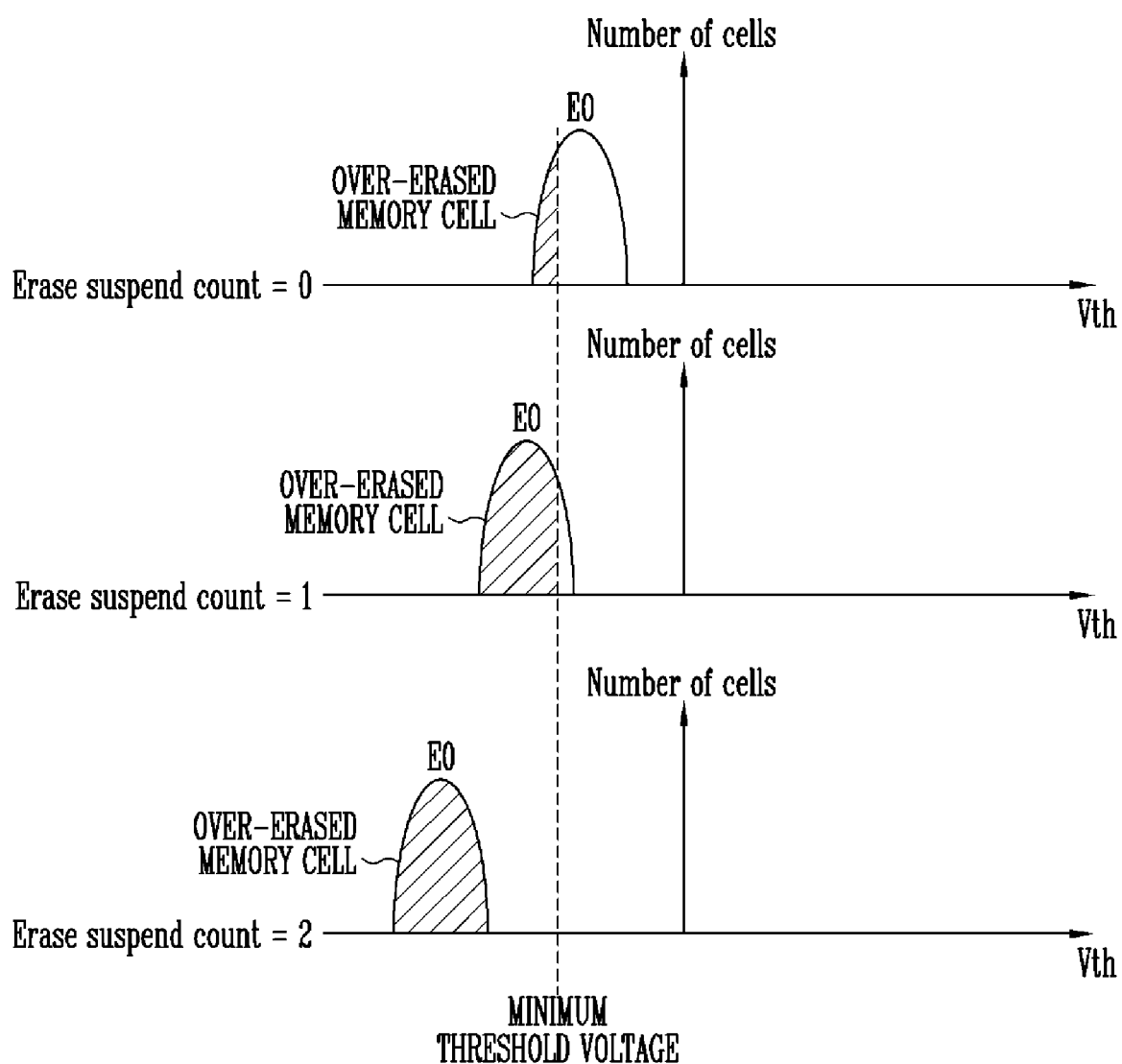
FIG. 11 is a diagram illustrating an exemplary threshold voltage distribution of memory cells depending on an erase suspend count.

FIG. 11 is a diagram illustrating an exemplary threshold voltage distribution of memory cells depending on an erase suspend count.

In FIG. 11, threshold voltage distributions when the erase suspend count is 0, 1 and 2 are illustrated as examples.

Referring to FIG. 11, it can be seen that the threshold voltage distribution of memory cells moves left along the threshold voltage axis to lower thresholds as the erase suspend count increases. That is, an erase depth of the memory cells increases when the erase suspend count increases. This may mean that the number of over-erased memory cells increases when the erase suspend count increases. Referring to FIG. 11, it can be seen that, when the erase suspend count is 1, the number of over-eased memory cells is greater as compared with when the erase suspend count is 0. Similarly, it can be seen that, when the erase suspend count is 2, the number of over-eased memory cells is greater as compared with when the erase suspend counter is 1.

Thus, determining different parameter values to be used for a soft program operation or normal program operation on a memory block according to an erase suspend count corresponding to the memory block can help shorten the time for performing the soft program operation or the normal program operation.

FIG. 12 is a diagram illustrating an exemplary program parameter policy in accordance with an embodiment of the present disclosure.

In FIG. 12, a first program parameter policy for the soft program operation and a second program parameter policy for the normal program operation are illustrated as an example. In some embodiments, three or more program parameter policies may be used, and in other embodiments only one program parameter policy may be used. For example, the first program parameter policy may be used for the soft program operation and the normal program operation.

Referring to FIG. 12, the program parameter policies define parameter values for each erase suspend count. In FIG. 12, a case where a program start voltage, a number of program loops, and a program step voltage are defined as parameters is illustrated as an example, but the present invention is not limited to this combination of parameters. For each of j+1 erase suspend counts, a set of values for program start voltage, number of program loops and program step voltage is defined in each policy.

The first program parameter policy defines that, when the erase suspend count of a memory block is 0, A0 is used as the program start voltage, B0 is used as the number of program loops, and C0 is used as the program step voltage. Similarly, the first program parameter policy defines parameter values corresponding to when the erase suspend count of the memory block is j (j is a natural number). The control logic may determine at least one parameter value to be used for the soft program operation with reference to the first program parameter policy.

The second program parameter policy defines that, when the erase suspend count of a memory block is 0, A0' is used as the program start voltage, B0' is used as the number of program loops, and C0' is used as the program step voltage. Similarly, the second program parameter policy defines parameter values corresponding to when the erase suspend count of the memory block is j (j is a natural number). The control logic may determine at least one parameter value to be used for the normal program operation with reference to the second program parameter policy. The parameters defined in the first program parameter policy may be different from those defined in the second program parameter policy. For example, a program start voltage $Aj$ defined in the first program parameter policy may be lower than a program start voltage $Aj'$ defined in the second program parameter policy. For example, a number of program loops $Bj$ defined in the first program parameter policy may be smaller than a number of program loops $Bj'$ defined in the second program parameter policy. For example, a program step voltage $Cj$ defined in the first program parameter policy may be lower than a program step voltage $Cj'$ defined in the second program parameter policy.

FIGS. 13 to 16 are diagrams illustrating an exemplary program parameter selected in a program operation using the ISPP scheme.

The program operation using the ISPP scheme, which is described with reference to FIGS. 13 to 16, may be applied to the soft program operation and the normal program operation.

Figure 13:
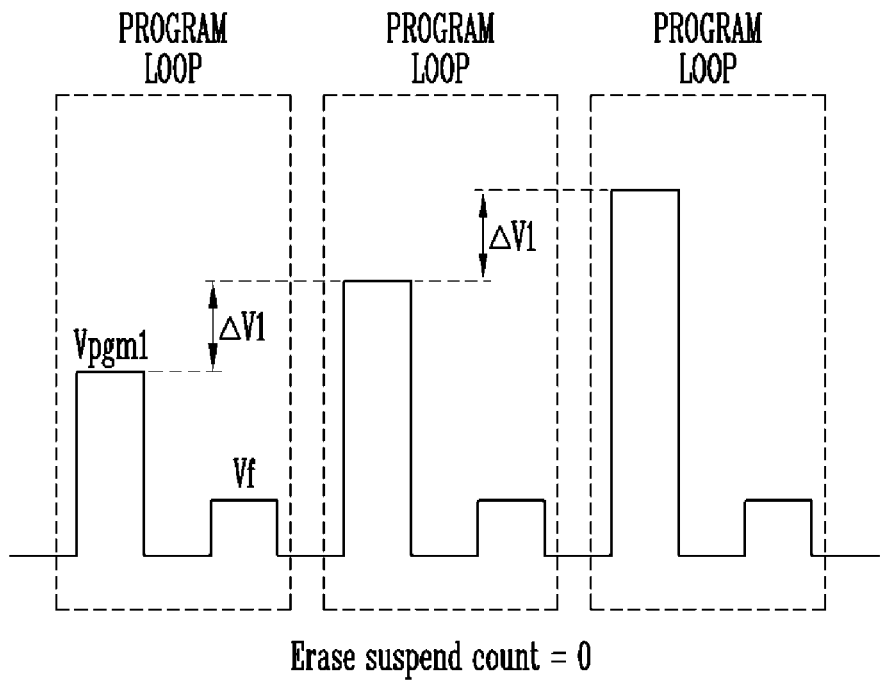
FIGS. 13 to 16 are diagrams illustrating an exemplary program parameter selected in a program operation using an ISPP scheme.

In FIG. 13, a case where the erase suspend count of a memory block is 0 is illustrated as an example. Referring to FIG. 13, applying a program voltage to the memory block and applying a verify voltage Vf to the memory block may constitute one program loop. In FIG. 13, a case where the program loop is performed three times is illustrated as an example. A program voltage used in a first program loop may be referred to as a first program start voltage Vpgm1. Whenever the program loop is repeated, the program voltage may be increased by a first step voltage $\Delta V1$, and a threshold voltage of memory cells may be increased by the increased program voltage.

Figure 14:
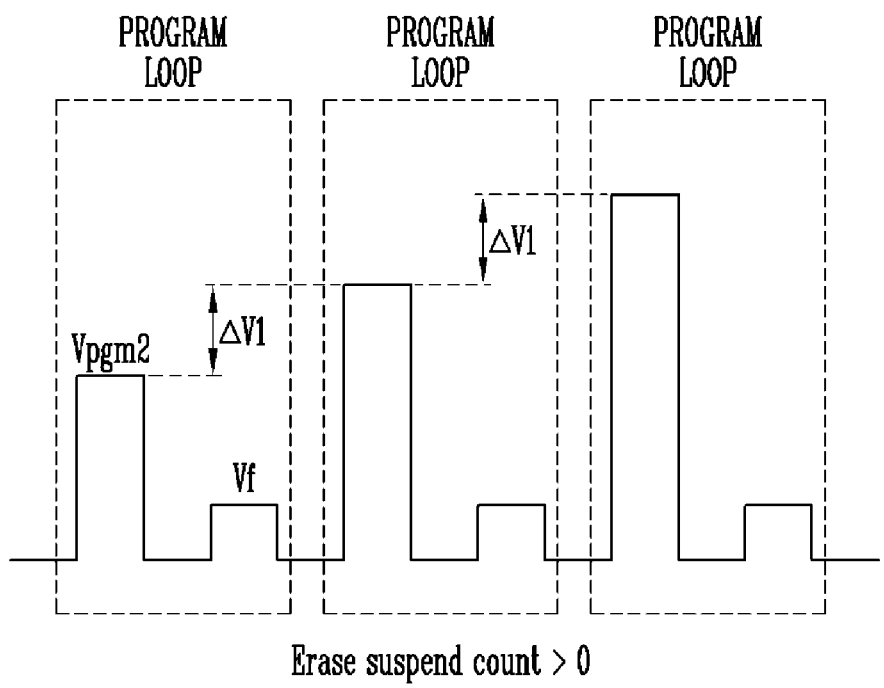

In FIG. 14, a program voltage when the erase suspend count of the memory block exceeds 0 is illustrated as an example. As described above, the program start voltage may increase as the erase suspend count of the memory block increases. Referring to FIG. 14, it can be seen that a second program start voltage Vpgm2 higher than the first program start voltage Vpgm1 described with reference to FIG. 13 is used in a first program loop.

Figure 15:
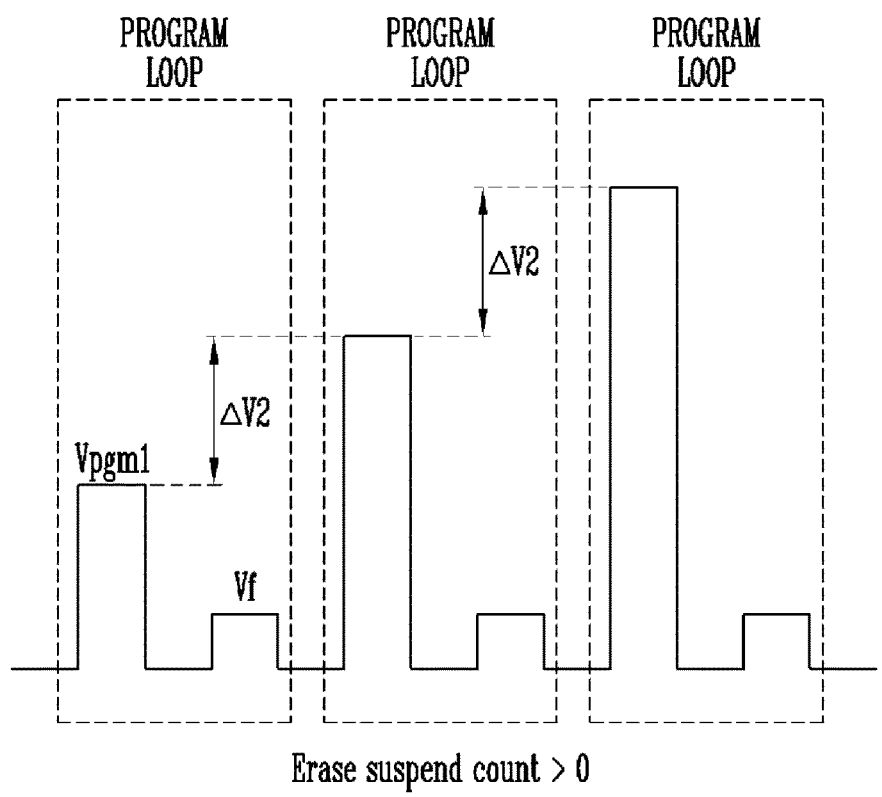

In FIG. 15, a program step voltage when the erase suspend count of the memory block exceeds 0 is illustrated as an example. As described above, the program step voltage may increase as the erase suspend count of the memory block increases. Referring to FIG. 15, it can be seen that a second step voltage $\Delta V2$ higher than the first step voltage $\Delta V1$ described with reference to FIG. 13 is used.

Figure 16:
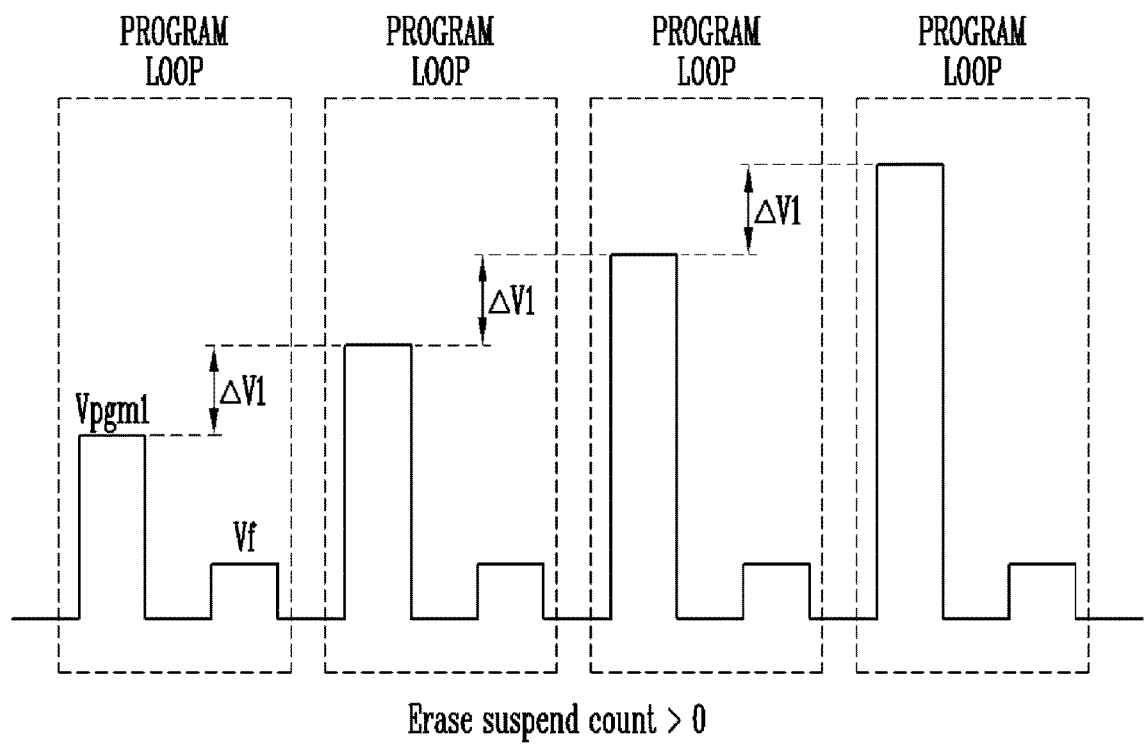

In FIG. 16, program loops when the erase suspend count of the memory block exceeds 0 are illustrated as an example. As described above, a number of program loops may increase as the erase suspend count of the memory block increases. Referring to FIG. 16, it can be seen that the number of program loops performed is greater than that performed in FIG. 13.

Figure 17:
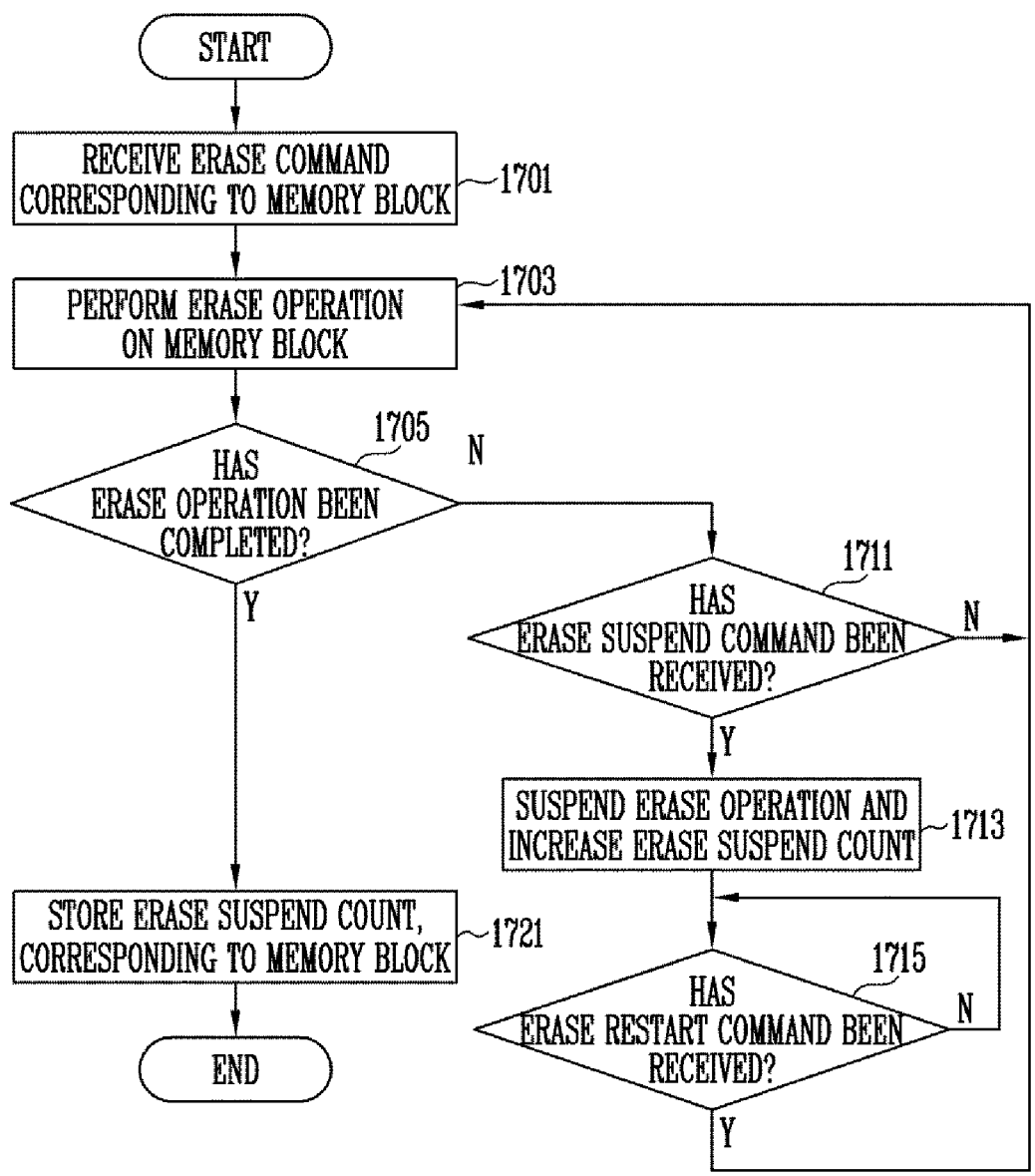
FIG. 17 is a flowchart illustrating an operating method of the memory device in accordance with an embodiment of the present disclosure.

FIG. 17 is a flowchart illustrating an operating method of the memory device in accordance with an embodiment of the present disclosure.

In some embodiments, at least one of steps shown in FIG. 17 may be omitted, and the order of the steps may be changed.

In step 1701, the memory device may receive an erase command and an address. The address may correspond to one or more memory blocks.

In step 1703, the memory device may perform an erase operation on a memory block corresponding to the address received in the step 1701.

In step 1705, the memory device may check whether the erase operation on the memory block is completed. When the erase operation on the memory block is completed (Y at step 1705), step 1721 may be performed. When the erase operation on the memory block is not completed (N at step 1705), step 1711 may be performed.

In the step 1711, the memory device may check whether an erase suspend command and an address are received. If so, (Y at step 1711), step 1713 may be performed. If not, (N at step 1711), the step 1703 may be performed.

In the step 1713, the memory device may suspend the current erase operation on the memory block corresponding to the address received. The memory device may increase, by 1, an erase suspend count corresponding to the memory block on which the erase operation is suspended.

In step 1715, the memory device may check whether an erase restart command and an address are received. When the erase restart command and the address are received (Y at step 1715), the process returns to step 1703 where an erase operation on the memory block corresponding to the received address may be restarted. When the erase restart command and the address are not received (N at step 1715), a state in which the erase operation on the memory block is suspended may be maintained until the erase restart command and the address are received.

In the step 1721, the memory device may manage or store a number of times the erase operation is suspended during the erase operation, corresponding to the memory block.

Figure 18:
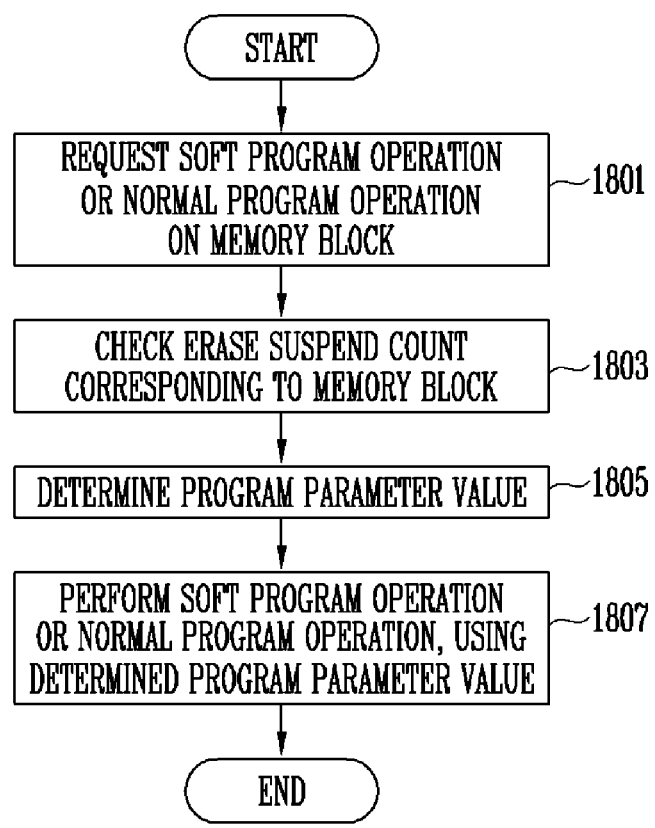
FIG. 18 is a flowchart illustrating an operating method of the memory device in accordance with an embodiment of the present disclosure.

FIG. 18 is a flowchart illustrating an operating method of the memory device in accordance with an embodiment of the present disclosure.

In some embodiments, at least one of steps shown in FIG. 18 may be omitted, and the order of the steps may be changed.

In step 1801, a soft program operation or normal program operation on a memory block may be requested. When a command instructing the memory device to perform the soft program operation on the memory block is received, the memory device may determine that the soft program operation on the memory block is requested. In another example, when an erase operation on the memory block is completed, the memory device may determine that the soft program operation on the memory block is requested. As for the normal program operation, when a program command, an address, and data are received from the memory controller, the memory device may determine that the normal program operation on the memory block is requested.

In step 1803, the memory device may check an erase suspend count corresponding to the memory block for which the soft program operation or normal program operation is requested.

In step 1805, the memory device may determine a program parameter value to be applied to the memory block for which the soft program operation or normal program operation is requested. In an embodiment, the program parameter value may be determined based on an erase suspend count corresponding to the memory block and a set program parameter policy.

In step 1807, the memory device may perform the soft program operation or normal program operation on the memory block, using the determined program parameter value.

Figure 19:
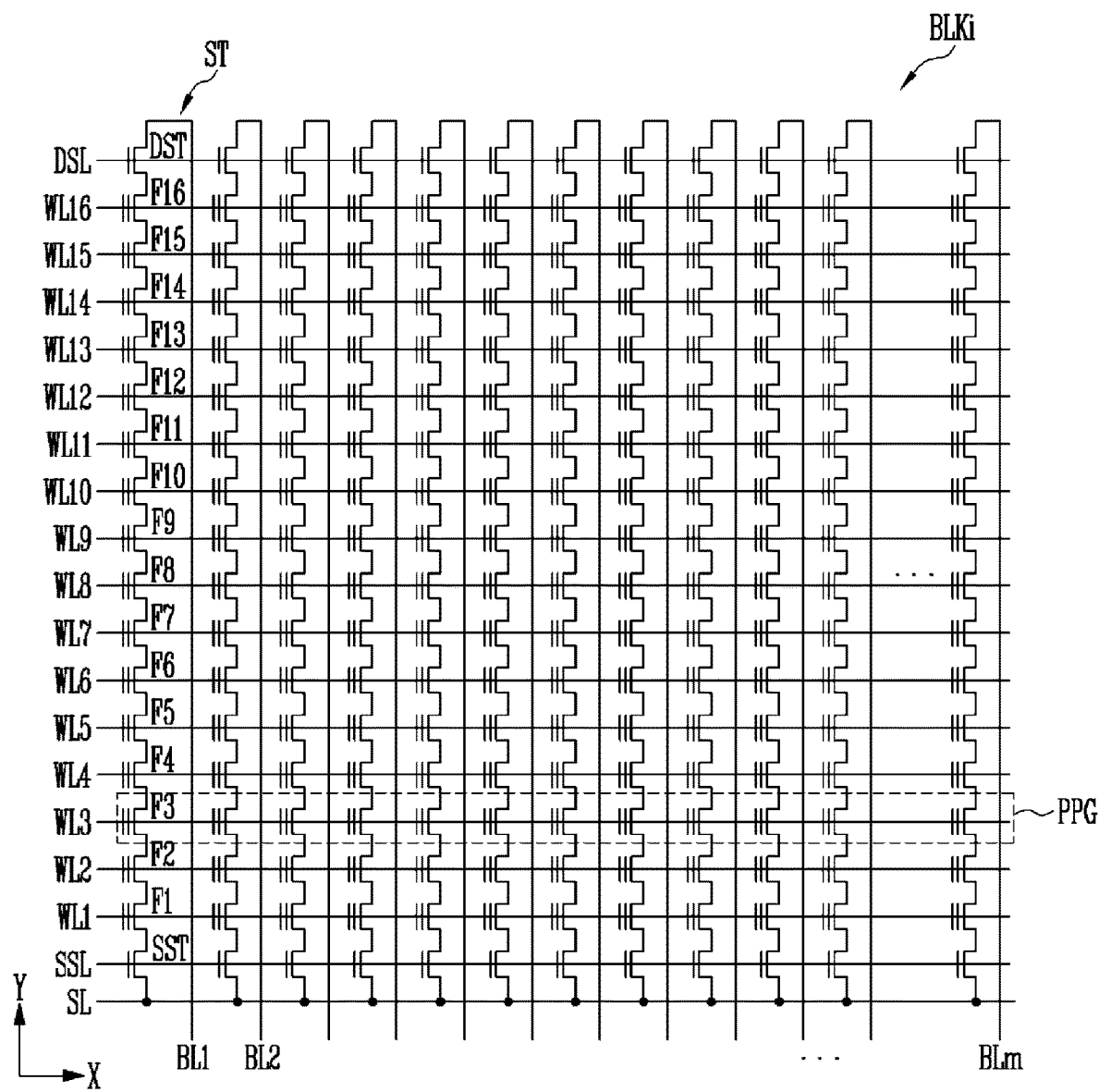
FIG. 19 is a diagram illustrating an exemplary memory block.

FIG. 19 is a diagram illustrating an exemplary memory block.

A memory cell array may include a plurality of memory blocks. A representative memory block BLKi among the plurality of memory blocks is illustrated in FIG. 19.

In the memory block BLKi, a plurality of word lines arranged in parallel to one another may be connected between a first select line and a second select line. The first select line may be a source select line SSL, and the second select line may be a drain select line DSL. Specifically, the memory block BLKi may include a plurality of strings ST connected between bit lines BL1 to BLm and a source line SL. The bit lines BL1 to BLm may be connected to the strings ST, respectively, and the source line SL may be commonly connected to the strings ST. The strings ST may be configured identically to one another, and therefore, a string ST connected to a first bit line BL1 will be described in detail as an example.

The string ST may include a source select transistor SST, a plurality of memory cells F1 to F16, and a drain select transistor DST, which are connected in series to each other between the source line SL and the first bit line BL1. At least one source select transistor SST and at least one drain select transistor DST may be included in one string ST, and more than the 16 memory cells F1 to F16 shown in the drawing may be included in one string ST.

A source of the source select transistor SST may be connected to the source line SL, and a drain of the drain select transistor DST may be connected to the first bit line BL1. The memory cells F1 to F16 may be connected in series between the source select transistor SST and the drain select transistor DST. Gates of source select transistors SST included in different strings ST may be connected to the source select line SSL, gates of drain select transistors DST included in different strings ST may be connected to the drain select line DSL, gates of the memory cells F1 to F16 included in different strings ST may be connected to a plurality of word lines WL1 to WL16. A group of memory cells connected to the same word line among the memory cells included in different strings ST may be a physical page PPG. Therefore, physical pages PPG of which number corresponds to that of the word lines WL1 to WL16 may be included in the memory block BLKi.

Figure 20:
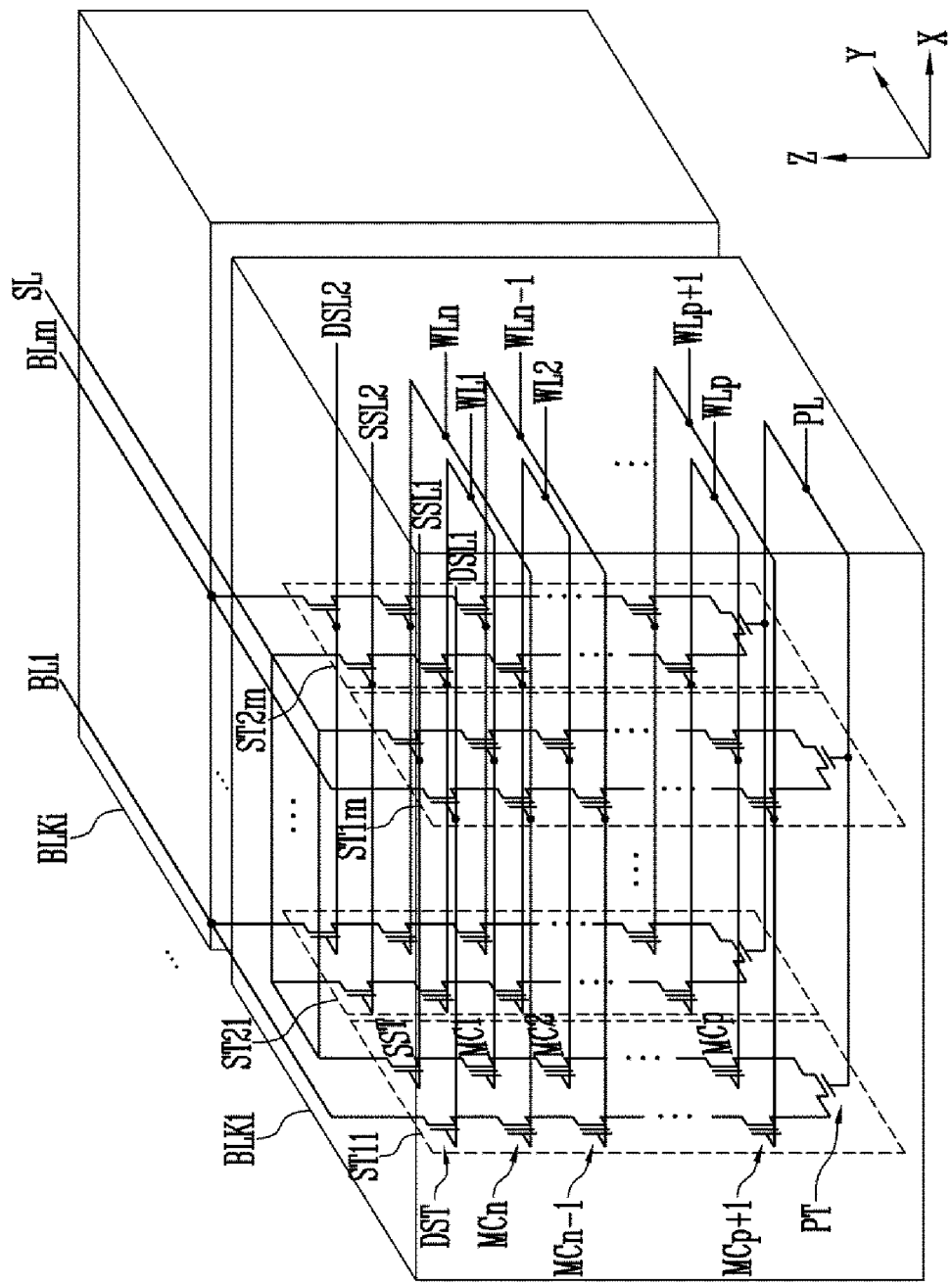
FIG. 20 is a diagram illustrating an embodiment of a three-dimensionally configured memory block.

FIG. 20 is a diagram illustrating an embodiment a three-dimensionally configured memory block.

The memory cell array may include a plurality of memory blocks BLK1 to BLKi. Since each of the blocks BLK1 to BLKi may be configured the same, a first memory block BLK1 is described as an example. The first memory block BLK1 may include a plurality of strings ST11 to ST1*m* and ST21 to ST2*m*. In an embodiment, each of the plurality of strings ST11 to ST1*m* and ST21 to ST2*m* may be formed in a 'U' shape. In the first memory block BLK1, m strings may be arranged in a row direction (X direction). Although FIG. 20 illustrates that two strings are arranged in a column direction (Y direction), this is for clarity; three or more strings may be arranged in the column direction (Y direction).

Each of the plurality of strings ST11 to ST1*m* and ST21 to ST2*m* may include at least one source select transistor SST, first to nth memory cells MC1 to MCn, a pipe transistor PT, and at least one drain select transistor DST.

The source and drain select transistors SST and DST and the memory cells MC1 to MCn may have structures similar to one another. For example, each of the source and drain select transistors SST and DST and the memory cells MC1 to MCn may include a channel layer, a tunnel insulating layer, a charge trapping layer, and a blocking insulating layer. For example, a pillar for providing the channel layer may be provided in each string. For example, a pillar for providing at least one of the channel layer, the tunnel insulating layer, the charge trapping layer, and the blocking insulating layer may be provided in each string.

The source select transistor SST of each string may be connected between a source line SL and memory cells MC1 to MCp.

In an embodiment, source select transistors of strings arranged in the same row may be connected to a source select line extending in the row direction, and source select transistors of strings arranged in different rows may be connected to different source select lines. In FIG. 20, source select transistors of strings ST11 to ST1m of a first row may be connected to a first source select line SSL1. Source select transistors of strings ST21 to ST2m of a second row may be connected to a second source select line SSL2.

In another embodiment, the source select transistors of the strings ST11 to ST1m and ST21 to ST2m may be commonly connected to one source select line.

First to nth memory cells MC1 to MCn of each string may be connected between the source select transistor SST and the drain select transistor DST.

The first to nth memory cells MC1 to MCn may be divided into first to pth memory cells MC1 to MCp and (p+1)th to nth memory cells MCp+1 to MCn. The first to pth memory cells MC1 to MCp may be sequentially arranged in a vertical direction (Z direction), and be connected in series to each other between the source select transistor SST and the pipe transistor PT. The (p+1)th to nth memory cells MCp+1 to MCn may be sequentially arranged in the vertical direction (Z direction), and be connected in series to each other between the pipe transistor PT and the drain select transistor DST. The first to pth memory cells MC1 to MCp and the (p+1)th to nth memory cells MCp+1 to MCn may be connected to each other through the pipe transistor PT. Gates of the first to nth memory cells MC1 to MCn of each string may be connected to first to nth word lines WL1 to WLn, respectively.

In an embodiment, at least one of the first to nth memory cells MC1 to MCn may be used as a dummy memory cell. When a dummy memory cell is provided, the voltage or current of a corresponding string can be stably controlled. A gate of the pipe transistor PT of each string may be connected to a pipe line PL.

The drain select transistor DST of each string may be connected to a bit line and the memory cells MCp+1 to MCn. Strings arranged in the row direction may be connected to a drain select line extending in the row direction. Drain select transistors of the strings ST11 to ST1m, of the first row may be connected to a first drain select line DSL1. Drain select transistors of the strings ST21 to ST2m of the second row may be connected to a second drain select line DSL2.

Strings arranged in the column direction may be connected to bit lines extending in the column direction. In FIG. 20, strings ST11 and ST21 of a first column may be connected to a first bit line BL1. Strings ST1m and ST2m of an mth column may be connected to an mth bit line BLm.

Memory cells connected to the same word line among the strings arranged in the row direction may constitute one page. For example, memory cells connected to the first word line WL1 among the strings ST11 to ST1m of the first row may constitute one page. Memory cells connected to the first word line WL1 among the strings ST21 to ST2m of the second row may constitute another page. When any one of the drain select lines DSL1 and DSL2 is selected, strings arranged in one row direction may be selected. When any one of the word lines WL1 to WLn is selected, one page among the selected strings may be selected.

Figure 21:
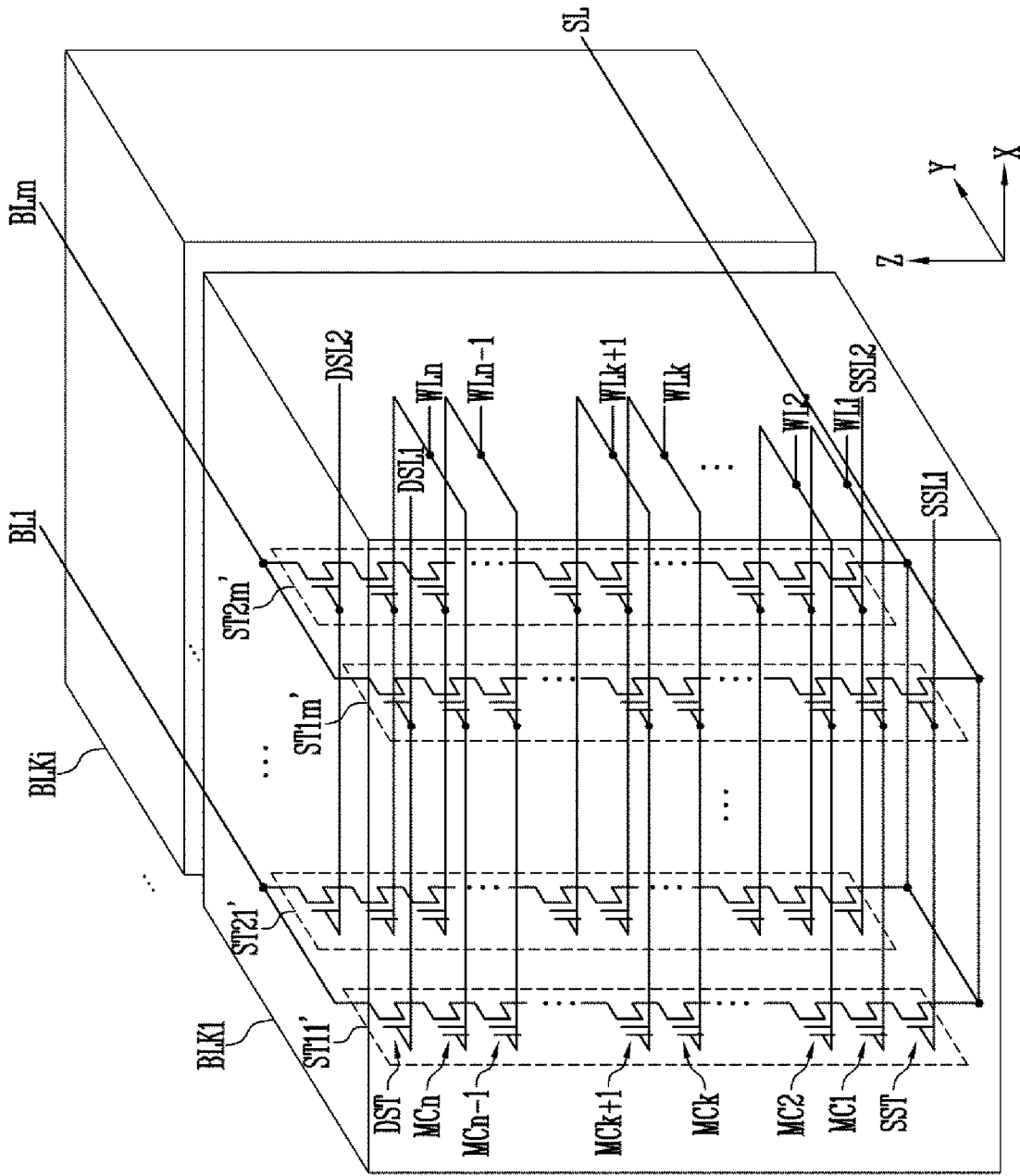
FIG. 21 is a diagram illustrating another embodiment of a three-dimensionally configured memory block.

FIG. 21 is a diagram illustrating another embodiment the three-dimensionally configured memory block.

The memory cell array may include a plurality of memory blocks BLK1 to BLKi, which may be configured the same. Thus, a first memory block BLK1 is described as an example. The first memory block BLK1 may include a plurality of strings ST11' to ST1m' and ST21' to ST2m'. Each of the plurality of strings ST11' to ST1m' and ST21' to ST2m' may extend along a vertical direction (Z direction). In the first memory block BLK1, m' strings may be arranged in a row direction (X direction). Although FIG. 21 illustrates that two strings are arranged in a column direction (Y direction), this is for clarity; three or more strings may be arranged in the column direction (Y direction).

Each of the plurality of strings ST11' to ST1m' and ST21' to ST2m' may include at least one source select transistor SST, first to nth memory cells MC1 to MCn, and at least one drain select transistor DST.

The source select transistor SST of each string may be connected between a source line SL and the memory cells MC1 to MCn. Source select transistors of strings arranged in the same row may be connected to the same source select line. Source select transistors of strings ST11' to ST1m' arranged on a first row may be connected to a first source select line SSL1. Source select transistors of strings ST21' to ST2m' arranged on a second row may be connected to a second source select line SSL2. In another embodiment, the source select transistors of the strings ST11' to ST1m' and ST21' to ST2m' may be commonly connected to one source select line.

The first to nth memory cells MC1 to MCn of each string may be connected in series to each other between the source select transistor SST and the drain select transistor DST. Gates of the first to nth memory cells MC1 to MCn may be connected to first to nth word lines WL1 to WLn, respectively.

In an embodiment, at least one of the first to nth memory cells MC1 to MCn may be used as a dummy memory cell. When a dummy memory cell is provided, the voltage or current of a corresponding string can be stably controlled. Accordingly, the reliability of data stored in the first memory block BLK1 can be improved.

The drain select transistor DST of each string may be connected between a bit line and the memory cells MC1 to MCn. Drain select transistors DST of strings arranged in the row direction may be connected to a drain select line extending in the row direction. The drain select transistors DST of the strings ST11' to ST1m' of the first row may be connected to a first drain select line DSL1. The drain select transistors DST of the strings ST21' to ST2m' of the second row may be connected to a second drain select line DSL2.

That is, the first memory block BLK1 of FIG. 21 may have a circuit identical to that of the first memory block BLK1 of FIG. 20, except that the pipe transistor PT is excluded from each string.

Figure 22:
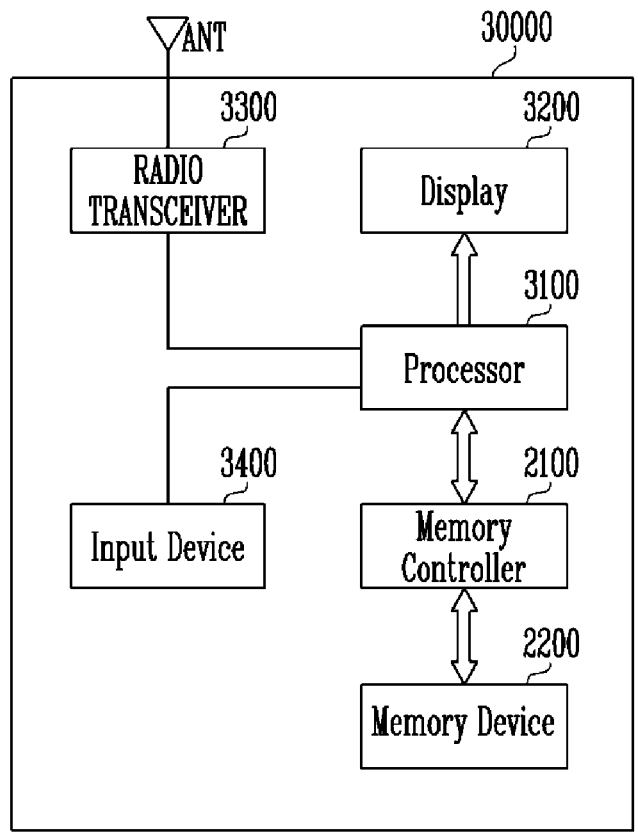
FIGS. 22 to 25 are diagrams illustrating other examples of the memory system including the memory device shown in FIGS. 1 to 3.

FIG. 22 is a diagram illustrating another example of the memory system including the memory controller shown in FIGS. 1 to 3.

Referring to FIG. 22, the memory system 30000 may be implemented as a cellular phone, a smart phone, a tablet PC, a personal digital assistant (PDA), or a wireless communication device. The memory system 30000 may include a memory device 2200 and a memory controller 2100 capable of controlling an operation of the memory device 2200.

The memory controller 2100 may control a data access operation of the memory device 2200, e.g., a program operation, an erase operation, a read operation, or the like under the control of a processor 3100.

Data programmed in the memory device 2200 may be output through a display 3200 under the control of the memory controller 2100.

A radio transceiver 3300 may transmit/receive radio signals through an antenna ANT. For example, the radio transceiver 3300 may convert a radio signal received through the antenna ANT into a signal that can be processed by the processor 3100. Therefore, the processor 3100 may process a signal output from the radio transceiver 3300 and transmit the processed signal to the memory controller 2100 or the display 3200. The memory controller 2100 may transmit the signal processed by the processor 3100 to the memory device 2200. Also, the radio transceiver 3300 may convert a signal output from the processor 3100 into a radio signal, and output the radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mount, a keypad, or a keyboard. The processor 3100 may control an operation of the display 3200 such that data output from the memory controller 2100, data output from the radio transceiver 3300, or data output from the input device 3400 can be output through the display 3200.

In some embodiments, the memory controller 2100 capable of controlling an operation of the memory device 2200 may be implemented as a part of the processor 3100, or be implemented as a chip separate from the processor 3100.

Figure 23:
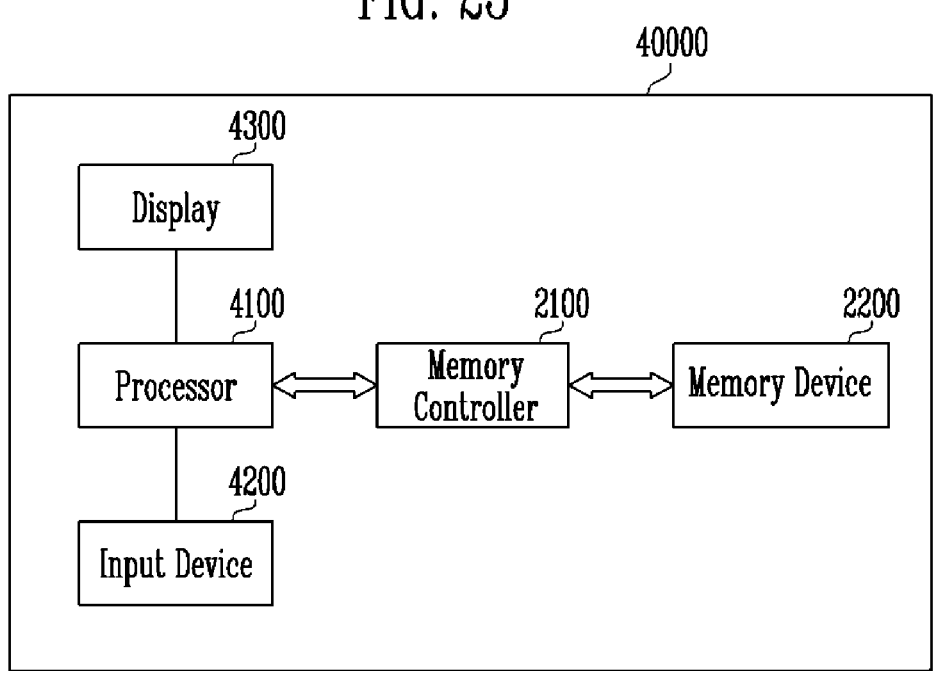

FIG. 23 is a diagram illustrating another example of the memory system including the memory controller shown in FIGS. 1 to 3.

Referring to FIG. 23, the memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include a memory device 2200 and a memory controller 2100 capable of controlling a data processing operation of the memory device 2200.

A processor 4100 may output data stored in the memory device 2200 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the memory controller 2100. In some embodiments, the memory controller 2100 capable of controlling an operation of the memory device 2200 may be implemented as a part of the processor 4100, or be implemented as a chip separate from the processor 4100.

Figure 24:
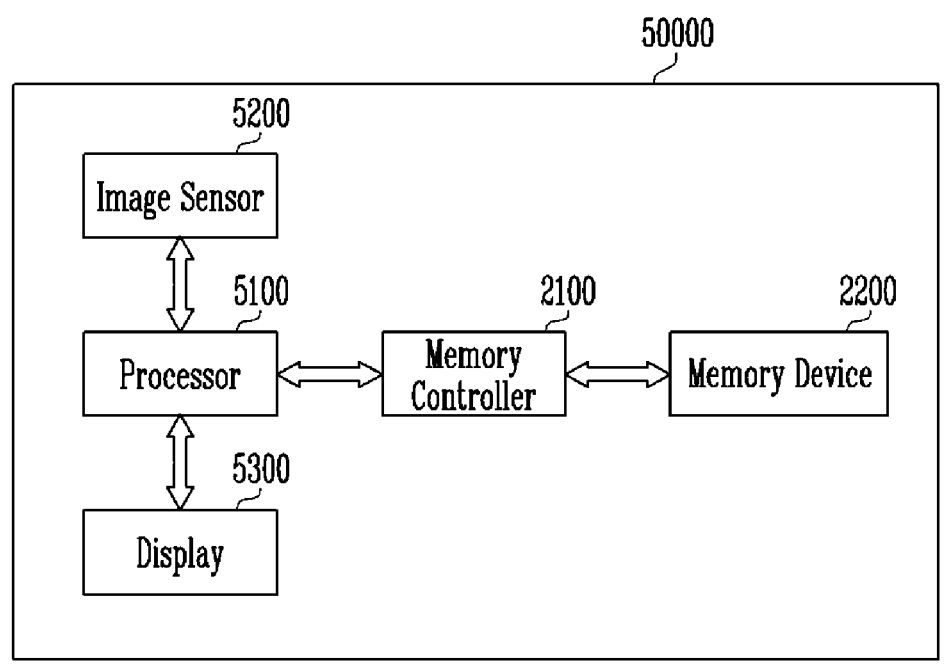

FIG. 24 is a diagram illustrating another example of the memory system including the memory controller shown in FIGS. 1 to 3.

Referring to FIG. 24, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a memory device 2200 and a memory controller 2100 capable of controlling a data processing operation of the memory device 2200, e.g., a program operation, an erase operation, or a read operation.

An image sensor 5200 of the memory system 50000 may convert an optical image into digital signals, and the converted digital signals may be transmitted to a processor 5100 or the memory controller 2100. Under the control of the processor 5100, the converted digital signals may be output through a display 5300, or be stored in the memory device 2200 through the memory controller 2100. In addition, data stored in the memory device 2200 may be output through the display 5300 under the control of the processor 5100 or the memory controller 2100.

In some embodiments, the memory controller 2100 capable of controlling an operation of the memory device 2200 may be implemented as a part of the processor 5100, or be implemented as a chip separate from the processor 5100.

Figure 25:
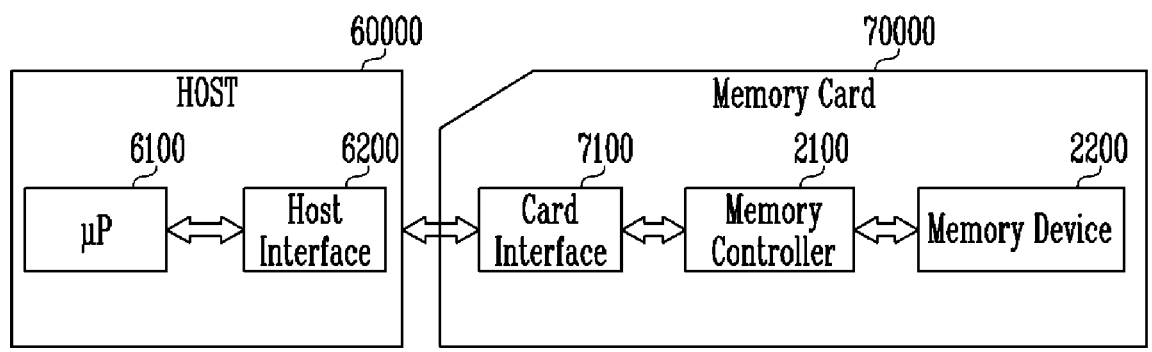

FIG. 25 is a diagram illustrating another example of the memory system including the memory controller shown in FIGS. 1 to 3.

Referring to FIG. 25, the memory system 70000 may be implemented as a memory card or a smart card. The memory system 70000 may include a memory device 2200, a memory controller 2100, and a card interface 7100.

The memory controller 2100 may control data exchange between the memory device 2200 and the card interface 7100. In some embodiments, the card interface 7100 may be a Secure Digital (SD) card interface or a Multi-Media Card (MMC) interface, but the present disclosure is not limited thereto.

The card interface 7100 may interface data exchange between a host 60000 and the memory controller 2100 according to a protocol of the host 60000. In some embodiments, the card interface 7100 may support a Universal Serial Bus (USB) protocol and an Inter-Chip (IC)-USB protocol. The card interface 7100 may mean hardware capable of supporting a protocol used by the host 60000, software embedded in the hardware, or a signal transmission scheme.

When the memory system 70000 is connected to a host interface 6200 of the host 60000 such as a PC, a tablet PC, a digital camera, a digital audio player, a cellular phone, console video game hardware, or a digital set-top box, the host interface 6200 may perform data communication with the memory device 2200 through the card interface 7100 and the memory controller 2100 under the control of a microprocessor (µP) 6100.

In accordance with embodiments of the present disclosure, a threshold voltage of over-erased memory cells can be increased in advance, and hence the retention performance of memory cells can be improved when a normal program operation is performed on the memory cells.

In accordance with embodiments of the present disclosure, a threshold voltage of over-erased memory cells can be increased in advance, and hence the time required to perform a normal program operation can be reduced.

Various embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory device comprising:
   an erase suspend count manager configured to store an erase suspend count representing a number of times an erase operation is suspended during the erase operation; and a program parameter value determiner configured to generate a parameter value to be used for a program operation on the memory block, based on the erase suspend count; and a program operation controller configured to perform the program operation on the memory block, using the determined parameter value.

2. The memory device of claim 1,
wherein the parameter value includes a program start voltage.

3. The memory device of claim 2, wherein the program parameter value determiner determines the program start voltage to have a higher voltage level as the erase suspend count increases.

4. The memory device of claim 1,
wherein the parameter value includes a number of program loops.

5. The memory device of claim 4, wherein the program parameter value determiner determines the number of program loops to be greater as the erase suspend count increases.

6. The memory device of claim 1,
wherein the parameter value includes a program step voltage.

7. The memory device of claim 6, wherein the program parameter value determiner determines the program step voltage to have a higher voltage level as the erase suspend count increases.

8. The memory device of claim 1, wherein the program operation is a soft program operation or a normal program operation.

9. The memory device of claim 1, wherein the program parameter value determiner determines the parameter value corresponding to the erase suspend count according to a program parameter policy defining parameter values with respect to a number of times an erase operation is suspended.

10. The memory device of claim 9, wherein the program parameter policy includes at least one of a first program parameter policy corresponding to a soft program operation and a second program parameter policy corresponding to a normal program operation.

11. The memory device of claim 1,
wherein the parameter value includes a pass voltage for applying to unselected word lines or a select voltage for applying to a select line during the program operation.

12. A method for operating a memory device, the method comprising:
performing an erase operation on a memory block;
suspending the erase operation on the memory block in response to an erase suspend command during the erase operation;
resuming the erase operation on the memory block in response to an erase resume command on the memory block while the erase operation on the memory block is suspended;
generating a counted number representing a number of times the erase operation is suspended until the erase operation on the memory block is completed; and
performing a program operation according to a parameter value determined based on the counted number.

13. The method of claim 12,
wherein the parameter value includes a program start voltage.

14. The method of claim 13, wherein the program start voltage has a higher voltage level as the counted number increases.

15. The method of claim 12,
wherein the parameter value includes a number of program loops.

16. The method of claim 15, wherein the number of program loops is greater as the counted number increases.

17. The method of claim 12,
wherein the parameter value includes a program step voltage.

18. The method of claim 17, wherein the program step voltage has a higher voltage level as the counted number increases.

19. The method of claim 12, wherein the program operation is a soft program operation or normal program operation.

20. The method of claim 12, the parameter value includes a pass voltage for applying to unselected word lines or a select voltage for applying to a select line during the program operation.

\* \* \* \* \*